US012564003B2

(12) United States Patent
Sunugatov et al.

(10) Patent No.: US 12,564,003 B2
(45) Date of Patent: Feb. 24, 2026

(54) SUBSTRATE MAPPING APPARATUS AND METHOD THEREFOR

(71) Applicant: Brooks Automation US, LLC, Chelmsford, MA (US)

(72) Inventors: Radik Sunugatov, Santa Clara, CA (US); Roy R. Wang, Palo Alto, CA (US); Karl Shieh, Fremont, CA (US); Justo Graciano, Hayward, CA (US); Austin Wise, Mountain View, CA (US); Casper Hansen, Mountain View, CA (US); Erick Pastor, San Jose, CA (US)

(73) Assignee: Brooks Automation US, LLC, Chelmsford, MA (US)

( * ) Notice: Subject to any disclaimer, the term of this patent is extended or adjusted under 35 U.S.C. 154(b) by 115 days.

(21) Appl. No.: 18/655,873

(22) Filed: May 6, 2024

(65) Prior Publication Data

US 2024/0290642 A1 Aug. 29, 2024

Related U.S. Application Data

(63) Continuation of application No. 17/362,599, filed on Jun. 29, 2021, now Pat. No. 12,002,696.

(Continued)

(51) Int. Cl.
*H01L 21/67* (2006.01)
*G01N 21/95* (2006.01)
(Continued)

(52) U.S. Cl.
CPC .......... *H01L 21/67265* (2013.01); *G06T 7/13* (2017.01); *H01L 21/6732* (2013.01); *H01L 21/67778* (2013.01); *G01N 21/9503* (2013.01)

(58) Field of Classification Search
CPC ........... H01L 21/67265; H01L 21/6732; H01L 21/67778; H01L 21/681; G06T 7/13; G06T 2207/30148; G06T 7/73; G01N 21/9503
See application file for complete search history.

(56) References Cited

U.S. PATENT DOCUMENTS 6,147,356 A 11/2000 Hahn et al.
6,188,323 B1 2/2001 Rosenquist et al.
(Continued)

FOREIGN PATENT DOCUMENTS

| KR | 20140085707 | 7/2014 |
|----|-------------|--------|
| KR | 20190046987 | 5/2019 |
| KR | 20190137952 | 12/2019 |

*Primary Examiner* — Georgia Y Epps
*Assistant Examiner* — Monica T Taba
(74) *Attorney, Agent, or Firm* — Perman & Green, LLP

(57) ABSTRACT

A semiconductor wafer mapping apparatus comprising a frame forming a wafer load opening communicating with a load station for a substrate carrier disposed to hold more than one wafers vertically distributed in the substrate carrier for loading through the wafer load opening, a movable arm movably mounted to the frame so as to move relative to the wafer load opening and having at least one end effector movably mounted to the movable arm to load wafers from the substrate carrier through the wafer load opening, an image acquisition system including an array of cameras arranged on a common support and each camera fixed with respect to the common support that is static with respect to each camera of the array of cameras, wherein each respective camera is positioned with a field of view disposed to view through the wafer load opening with the common support positioned by the movable arm.

23 Claims, 26 Drawing Sheets

Related U.S. Application Data

(60) Provisional application No. 63/046,555, filed on Jun. 30, 2020.

(51) Int. Cl.
    *G06T 7/13*          (2017.01)
    *H01L 21/673*       (2006.01)
    *H01L 21/677*       (2006.01)

(56) References Cited

U.S. PATENT DOCUMENTS

| | | | |
|---|---|---|---|
| 6,208,909 B1 * | 3/2001 | Kato | H01L 21/67778 |
| | | | 414/331.14 |
| 6,452,503 B1 | 9/2002 | Weiss | |
| 6,636,626 B1 | 10/2003 | Yoo et al. | |
| 6,825,486 B1 | 11/2004 | Cole et al. | |
| 7,015,492 B2 | 3/2006 | Garssen et al. | |
| 7,202,491 B2 | 4/2007 | Garssen et al. | |
| 8,837,777 B2 | 9/2014 | Yasuda et al. | |
| 10,607,879 B2 | 3/2020 | Cavins et al. | |
| 10,784,134 B2 | 9/2020 | Peh et al. | |
| 2005/0035313 A1 | 2/2005 | Garssen et al. | |
| 2005/0110287 A1 | 5/2005 | Florindi et al. | |
| 2017/0125272 A1 | 5/2017 | Van Gogh et al. | |

* cited by examiner

LIGHT PATH
FROM 220V2

110C
α α

LIGHT PATH
FROM 220V1

888P

888

PATH OF LIGHT
ILLUMINATING
SUBSTRATES

751

277

750

220V2     220V1

TRUE PROFILES
(TELE-PHOTO
LENS AT CENTER)

RAW PROFILES
(WIDE-ANGLE
LENS AT CENTER)

SLOT 13 WAFER EDGE VS EXPECTED FLAT WAFER EDGE

SLOT 13 SHAPE

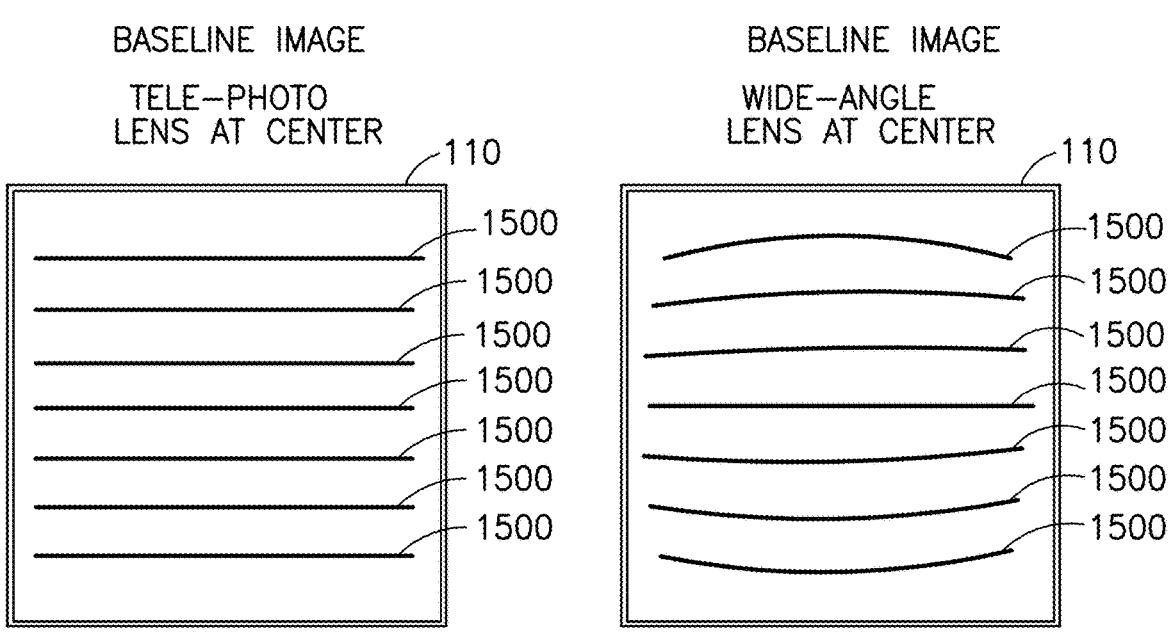
BASELINE IMAGE
TELE-PHOTO
LENS AT CENTER
— 110
— 1500
— 1500
— 1500
— 1500
— 1500
— 1500
— 1500
FIG.15A
BASELINE IMAGE
WIDE-ANGLE
LENS AT CENTER
— 110
— 1500
— 1500
— 1500
— 1500
— 1500
— 1500
— 1500
FIG.15B
BASELINE IMAGE
(WIDE-ANGLE
LENS AT TOP)
— 110
— 1500
— 1500
— 1500
— 1500
— 1500
— 1500
FIG.15C
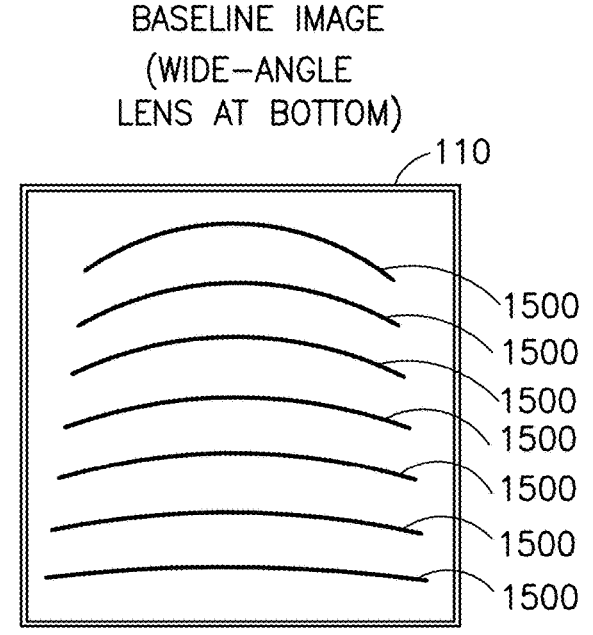
BASELINE IMAGE
(WIDE-ANGLE
LENS AT BOTTOM)
— 110
— 1500
— 1500
— 1500
— 1500
— 1500
— 1500
— 1500
FIG.15D

RAW IMAGES OF REGIONS

TRUE IMAGES OF REGIONS

SUBSTRATE MAPPING APPARATUS AND METHOD THEREFOR

This application is a continuation of U.S. non-provisional patent application Ser. No. 17/362,599, filed on Jun. 29, 2021, which claims the benefit of and priority from U.S. Provisional patent application No. 63/046,555, filed Jun. 30, 2020, the disclosures of which are incorporated herein by reference in its entirety.

BACKGROUND

1. Field

The exemplary embodiments generally relate to semiconductor fabrication equipment, and more particularly, to identification of substrate in semiconductor fabrication equipment.

2. Brief Description of Related Developments

There are various places that a single substrate or a stack of substrates (such as, e.g., wafers, reticles, film-frames, trays, etc.) can be held in semiconductor fabrication equipment. The physical state of the substrate at each of these locations can be one of many, including but not limited to, absent, present, double-slotted, cross-slotted, and shifted/tilted. Generally, the physical state of each substrate at the holding locations is determined (or mapped) to facilitate substrate handling within the semiconductor fabrication equipment.

One example of substrate mapping of a single substrate, such as located on a robotic end effector, includes a vacuum-suction technique where a vacuum suction cup is in contact with the back side of the substrate. By opening a valve on a vacuum line of the end effector, the vacuum pressure level of the suction cup determines the substrate state, which in this case is present or absent (the vacuum-suction technique does not detect substrate shifting). The vacuum-suction technique may result in a false reading when the contact of the substrate with the vacuum suction cup is not tightly sealed. In addition, it takes a few hundred milliseconds of time between activation of the vacuum valve and establishing a steady state vacuum pressure level to obtain a determination of the presence or absence of the substrate on the end effector. As may be realized, a few hundred milliseconds over a number of wafers has a negative impact on substrate throughput through the semiconductor fabrication equipment.

Generally, for mapping a stack of substrates (with gaps separating each of the stacked substrates) held at, for example, a load port in a substrate cassette or carrier, a break-beam technique is employed. Here a light beam extends from a transmitter to a receiver in a direction parallel to the substrate planes. The transmitter and receiver may be referred to as a through-beam sensor. The through-beam sensor is moved up or down along a side of the substrate stack so that the light beam engages and is broken by the substrates (a break in the light beam indicates a presence of a substrate). While the break-beam technique can detect many of the substrate states noted above, the break-beam technique is sensitive to the angle of the light beam relative to the substrate planes such that it is desired the light beam be precision aligned with the substrate planes. Here, extending and retracting the through-beam sensor to and from the substrate holding location takes at least a few seconds and the correlation of beam breaking and beam restoring events for each substrate position generally entails a controlled and slow motion profile of the through-beam sensor, all of which negatively impact substrate throughput.

Both the vacuum-suction and break-beam techniques involve complexity in mechanical design. For example, the vacuum-suction technique employs a vacuum supply to the substrate handling equipment, and involves routing a vacuum line through a substrate transport arm to the end effector. The break-beam technique involves moving parts as well as extension and retraction of the through-beam sensor. This increased complexity increases the costs of manufacturing and servicing the semiconductor processing equipment.

In addition to the above, in advanced semiconductor fabrication technology the substrates are provided with varied thicknesses. The different thicknesses of the substrates pose a challenge to the break-beam technique in determining the map of the substrate holding location. For example, thin substrates may have a thickness that does not completely block the light beam resulting in a false identification of an absent substrate.

Imaging systems have also been employed for substrate mapping; however, in conventional image mapping systems substrates, such as those imaging substrates through a load port opening, images of substrates towards the top (or bottom) of the substrate stack may be distorted or some substrates may be blocked from view by substrates positioned above or below. There may also be an issue with light reflecting off of the substrates and/or an interior of the substrate carrier which reflected light may obscure substrate detection.

Further, in semiconductor fabrication facilities, various types of substrates (as noted above) are transported by substrate transports (e.g., robots) having end effectors on which the substrates are seated for transport. To transport a substrate, the substrate transport extends the end effector into a small space below (or from above for some applications) the substrate (e.g., seated on a substrate seating surface of a substrate carrier, process module, or other suitable substrate holding location) to pick up the substrate. Picking the substrate with the end effector poses no issues where the substrate is flat; however, as noted above, in advanced semiconductor fabrication technology the substrates are provided with varied thicknesses and may not be flat. For example, thinned substrates, reconstructed substrates, and fan-out substrates in advanced packaging may bow/warp up to a few millimeters. The warping of these substrates may prevent an end effector from extending into the small space below (or above) the substrate to pick the substrate up.

BRIEF DESCRIPTION OF THE DRAWINGS

The foregoing aspects and other features of the disclosed embodiment are explained in the following description, taken in connection with the accompanying drawings, wherein:

FIGS. 15A, 15B, 15C, and 15D illustrate exemplary baseline images of a substrate carrier in accordance with aspects of the present disclosure.

DETAILED DESCRIPTION

Figure 1A:
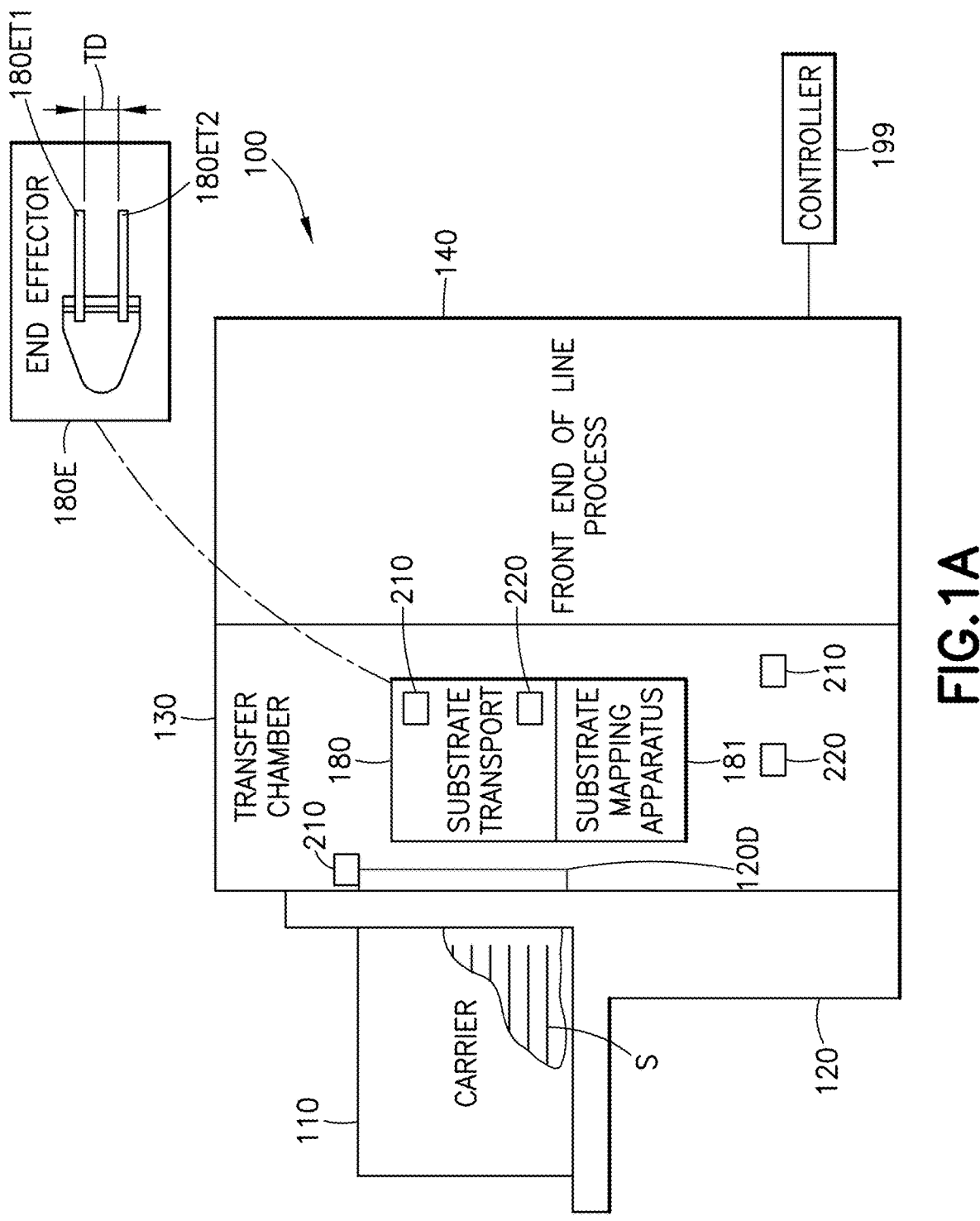
FIGS. 1A, 1B, and 1C are exemplary substrate processing apparatus incorporating aspects of the present disclosure.
Figure 1B:
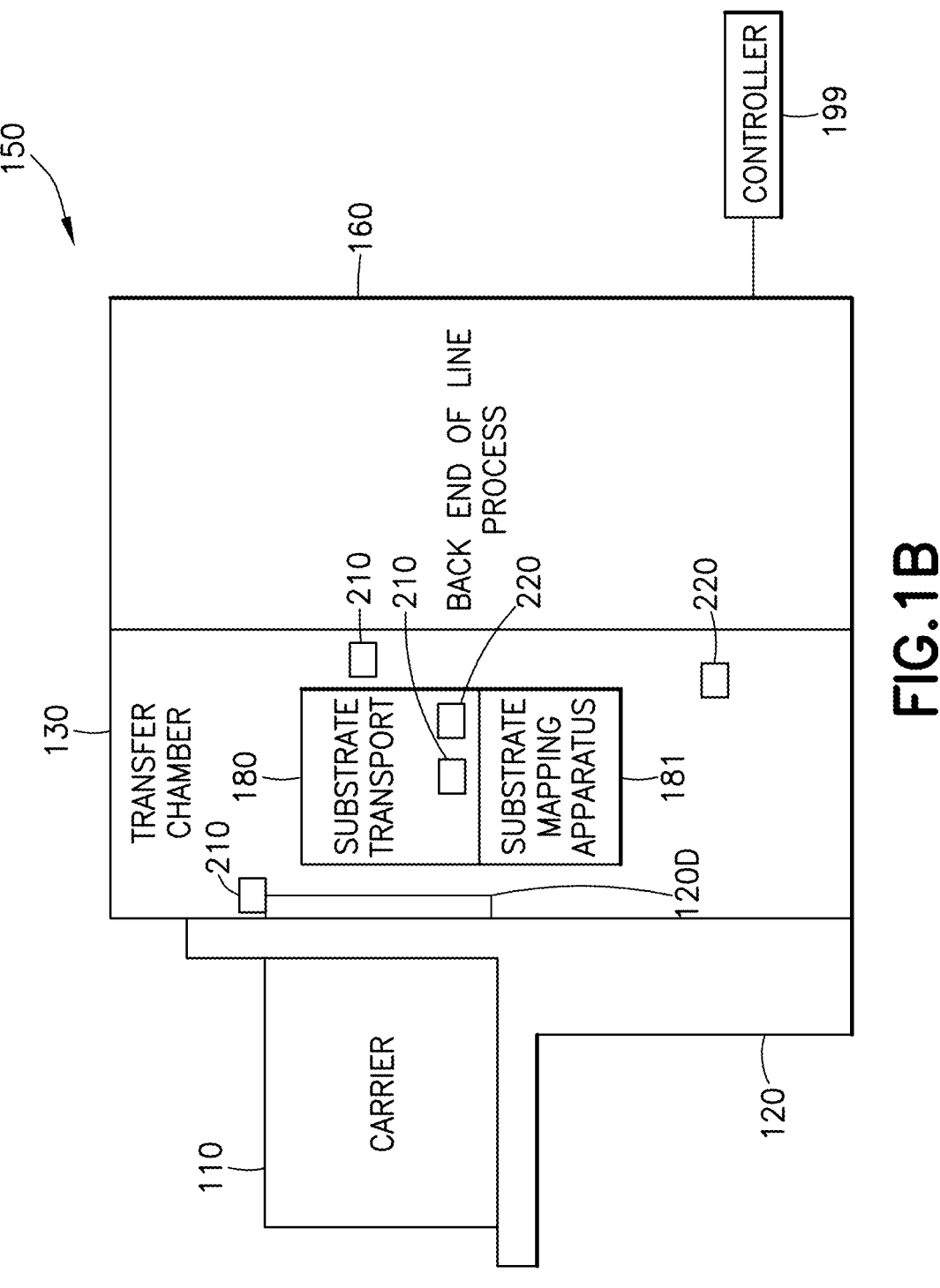
Figure 1C:
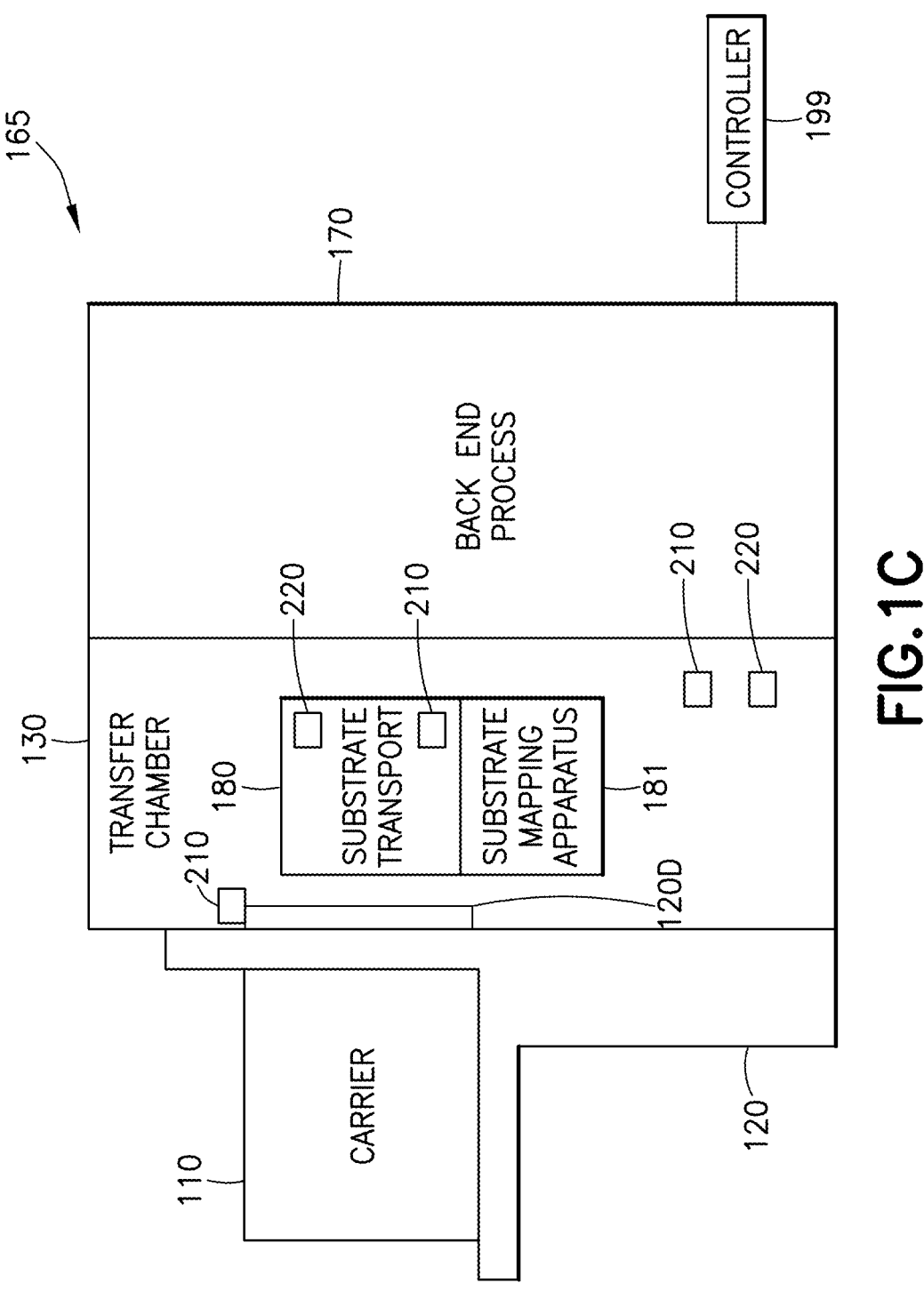

FIGS. 1A, 1B, and 1C illustrate exemplary substrate processing apparatus 100, 150, 165 in accordance with aspects of the present disclosure. Although the aspects of the present disclosure will be described with reference to the drawings, it should be understood that the aspects of the present disclosure can be embodied in many forms. In addition, any suitable size, shape or type of elements or materials could be used.

Referring to FIGS. 1A, 1B, 1C, and 2A, the aspects of the present disclosure provide a substrate mapping apparatus 181 (also referred to herein as a semiconductor wafer mapping apparatus) that includes a machine vision system 200 (also referred to herein as an image acquisition system) and at least one illuminator 220 (e.g., distributed direct or indirect light source including, but not limited to, LEDs, fluorescent light, flood light, light arrays, etc., or a combination thereof) for performing substrate mapping and/or substrate edge profiling. In accordance with the aspects of the present disclosure the machine vision system 200 includes at least one camera 210 (or any suitable image acquisition sensor). The at least one camera 210 of the machine vision system 200 and the at least one illuminator 220 are placed at one or more positions to capture images of a substrate stack 270 disposed at any suitable location of the substrate processing apparatus 100, 150, 165. In some aspects, the at least one camera 210 is a camera array 277 (also referred to herein as a camera system or array of cameras) as described herein. A substrate map 280 (referred to herein as a map) of the substrates S (also referred to herein as wafers) in the substrate stack 270 is determined from, for example, true edge profiles 500T (see FIG. 5) (or in some aspects corrected true edge profiles 500TC as shown in, e.g., FIG. 10) of substrates S in the substrate stack 270 through any suitable analyzation/processing of the captured images of the substrates S in the substrate stack 270. As may be realized from the present disclosure, the substrate mapping apparatus 181 disclosed herein overcomes the deficiencies, such as those noted above, of conventional substrate mappers. The substrate mapping apparatus 181 of the present disclosure is substantially free of moving parts and can be integrated into any suitable semiconductor fabrication equipment (also referred to herein as substrate processing apparatus), such as substrate processing apparatus 100, 150, 165 (or one or more components thereof) while providing opportunity to enhance substrate mapping through software, substantially free from hardware upgrades. As will also be described herein, the aspects of the present disclosure provide for advanced mapping application including, but not limited to, measuring substrate edge profiles that may not be flat.

The aspects of the present disclosure also provide for measuring edge profiles of the substrates S so that a distance TD (see FIG. 1A) between substrate holding tines 180ET1, 180ET2 of an end effector 180E (see also FIG. 8A) of a substrate transport 180 (See FIG. 1A) can be adjusted to pick up warped/bowed substrates. Suitable examples of end effectors having adjustable tines can be found in U.S. patent application Ser. No. 15/693,871 filed on Sep. 1, 2017 and titled "Substrate Processing Apparatus", the disclosure of which is incorporated by reference herein in its entirety. Suitable examples of a substrate transport 180 in which the end effectors with adjustable substrate holding tines 180ET1, 180ET2 can be incorporated is described in U.S. patent application Ser. No. 14/928,352 filed on Oct. 30, 2015 and titled "Wafer Aligner", the disclosure of which is incorporated herein by reference in its entirety. As will be described herein, the at least one camera 210 and the at least one illuminator 220 are disposed at positions that capture images of the substrate S or the substrate stack 270 across a width of the substrate(s) S. The edge profile of each substrate S is defined from processing the captured images. Based on the edge profiles of the substrate(s), the available space below each substrate S across its width is determined in any suitable manner. The substrate transport 180 under control of any suitable controller, such as controller 199, commands adjustment of a distance TD (see FIG. 1A) between substrate holding tines 180TE1, 180TE2 of the end effector 180E so that the tines extend into regions underneath the warped/bowed substrate S having clearance that allows the end effector 180E to extend under the substrate S.

Generally, as described in greater detail herein, the aspects of the present disclosure employ the at least one camera 210 to capture images of outer edges 233 of substrates while the substrates are illuminated by the at least one illuminator 220. Here, any suitable controller (such as controller 199) defines the substrate edge profiles from the captured image(s) using any suitable algorithms such as those described herein. A number of data points on the outer edge 233 of each substrate imaged by the at least one camera 210 is maximized through the employment of distributed and diffused illumination across the substrate width W where multiple exposure techniques (e.g., adjusting exposure speed, aperture, etc.) for different sections of the substrate width are employed. The accuracy of the data points on the outer edge 233 of each substrates S is maximized by an algorithm (e.g., which is programmed into the controller 199) that captures and stores the edge profiles of a standard substrate as spatial calibration data 281 (as will be described in greater detail herein). At runtime of the substrate mapping apparatus 181 for determining the map 280 and/or edge profiles, the measured substrate raw profiles are compared against the spatial calibration data 281 to determine corrected true profiles 500TC of the substrates S (See FIGS. 10-13). The raw profile is the edge profile of a substrate as seen by a respective camera (i.e., the projection of the three-dimensional substrate edge onto the two-dimensional plane of the camera's field of view—see the left-hand side in FIG. 5 and also FIGS. 9B-9D). The true profile 500T and/or corrected true profile 500TC is what an end effector 180E of a substrate transport 180 would "see" when picking a substrate S (i.e., a straight-on projection of the three-dimensional substrate edge onto the plane of extension/retraction of the end effector 180E—see the right-hand side of FIG. 5 and also FIG. 9A).

Referring to FIGS. 1A, 1B, and 1C, the aspects of the present disclosure will be described with respect to substrate processing apparatus 100, 150, 165; however, the aspects of the present disclosure are equally applicable to sorters where multiple carriers 110 are coupled to a transfer chamber 130 and substrates are moved from one carrier 110 to another carrier 110 by a substrate transport 180 within the transfer chamber 130 (e.g., to arrange the substrates in one or more carriers according to a predetermined sequence/order), where there is no substrate process (such as process 140, 160, 170) included in the sorter. Referring to FIG. 1A, the substrate processing apparatus 100 includes a load port 120, a transport chamber 130, and any suitable front end of line process 140 (e.g., generally including thin film processes that use vacuum such as etching, chemical vapor deposition, plasma vapor deposition, implantation, metrology, rapid thermal processing, dry strip atomic layer, oxidation/diffusion, forming of nitrides, lithography, epitaxy, or other thin film processes for fabrication of individual semiconductor structures patterned in the semiconductor up to, but not including, the deposition of metal interconnect layers). The load port 120 is coupled to a transport chamber 130 and is configured to interface any suitable substrate cassette or carrier 110 to the transport chamber 130. The transport chamber 130 is coupled to the front end of line process 140 and includes any suitable opening and/or valves through which substrates are passed between the transport chamber 130 and the front end of line process 140.

The transport chamber 130 includes substrate transport 180 configured to transfer substrates S between the substrate carrier 110 and the front end of line process 140. Here the substrate transport 180 includes the transport arm 180TA having an end effector 180E for loading and unloading substrates S to and from the substrate carrier 110 through an opening 888 of the load port 120. As noted above, a suitable example of a substrate transport 180 can be found in U.S. patent application Ser. No. 14/928,352 filed on Oct. 30, 2015 and titled "Wafer Aligner", the disclosure of which was incorporated herein by reference in its entirety. For example, referring also to FIGS. 8A and 8B, the aspects of the disclosed embodiment will be described with respect to an atmospheric transport robot 180 but it should be understood that the aspects of the disclosed embodiment are equally applicable to vacuum transport robots such as those found in the front end of line process 140, the back end of line process 160, and the back end process 170. As may be realized, the substrate transport 180 is mounted to a linear slide 850 or a boom arm BA (such as described in U.S. patent application Ser. No. 14/377,987 filed on Aug. 11, 2014 entitled "Substrate Processing Apparatus" the disclosure of which is incorporated herein by reference in its entirety) so as to be movable in at least the X and/or Y directions while in other aspects the substrate transport so as to be fixed from movement in the X and/or Y directions. The configuration shown is representative for description purposes only and the arrangement, shapes and placement of the illustrated components may be varied as desired without deviating from the scope of the invention.

As can be seen in FIGS. 1A-1C and 8A, in one aspect, the substrate transport 180 is movably mounted to a frame 800 of the transport chamber 130 or in other aspects to a frame of any suitable module of the substrate processing apparatus 100, 150, 165. As may be realized, the frame 800 includes one or more openings 888 (also referred to herein as a wafer load opening) communicating with the load port 120 (also referred to herein as a load station) for the substrate carrier 110 that is disposed on the load port 120 to hold one or more than one substrate S in a vertically distributed arrangement (as described herein) for loading into the substrate processing apparatus 100 (and similarly into the substrate processing apparatus 150, 165 described herein) through the opening 888. The substrate transport 180 includes a transport arm 180TA (also referred to herein as a movable arm) that, in one aspect, is mounted to a carriage 863 so that the transport arm 180TA is movably mounted to the frame 800. The carriage 863 is, in one aspect, mounted to the linear slide 850 so as to be movable in the X direction while in other aspects the carriage 863 is mounted to the frame 800 so as to be fixed in the X (and/or Y direction). In one aspect any suitable drive 867 is mounted to the frame 800 and drivingly connected to the carriage 863 by any suitable transmission for moving the transport arm 180TA in the X direction. In this aspect the transmission is a belt and pulley transmission and the drive is a rotary drive but in other aspects the drive 867 is a linear actuator that is drivingly connected to the carriage 863 with any suitable transmission or without a transmission (e.g. such as where the carriage includes a drive portion of the linear actuator). Here the transport arm 180TA includes a rotational drive 862, a Z-drive column 830, a slide body 820 and one or more end effectors 180E. The rotational drive 862 is any suitable rotational drive mounted to the carriage 863 and the Z drive column 830 is mounted to an output of the rotational drive 862 so as to rotate in the direction of arrow T about the θ axis (e.g. the θ direction). The slide body 820 is movably mounted to the Z drive column 830 where the Z-drive column 830 includes any suitable drive motor and/or transmission for moving the slide body 820 in the Z direction.

The one or more (e.g. at least one) end effectors 180E are movably mounted to the slide body 820 in any suitable manner so as to extend and retract in the R direction (noting the R direction rotates about axis θ so that extension of the end effector(s) 180E can be aligned with the X or Y axes or at any suitable rotational angle in the X-Y plane). While two end effectors 180E are illustrated for exemplary purposes only it should be understood that any suitable number of end effectors are mounted to the slide body 820. As may be realized, the one or more end effectors 180E traverse, with the transport arm 180TA as a unit, in a first direction (e.g. one or more of the X, Y and Z directions) relative to the frame 800 and traverses linearly, relative to the transport arm 180TA, in a second direction (e.g. the R direction) that is different from the first direction. The slide body 820 includes one or more linear drives 825 configured to independently move each end effector 180E in the R direction. The one or more linear drives 825 are any suitable drive(s) having any suitable transmissions which in one aspect are substantially similar to those described in, for example, U.S. provisional patent application No. 61/917,056 filed on Dec. 17, 2013 entitled "Substrate Transport Apparatus", the disclosure of which is incorporated by reference herein in its entirety. The end effectors 180E are arranged on the slide body 820 so that they are stacked one over the other so as to have a common axis R of extension and retraction. The end effectors may also include any suitable drives for adjusting the distance TD (see FIG. 1A) between the end effector tines 180ET1, 180ET2 as described in U.S. patent application Ser. No. 15/693,871 filed on Sep. 1, 2017 and titled "Substrate Processing Apparatus", the disclosure of which was incorporated by reference herein in its entirety.

The carrier 110 may be any suitable carrier 110 such as a front opening carrier (illustrated in FIGS. 1A and 1B—a suitable example of which is a front opening unified pod (FOUP)) or bottom opening carrier (a suitable example of which is a standard mechanical interface (SMIF) pod). In one aspect, the carrier 110 may be substantially similar to those described in U.S. Pat. No. 9,105,673 issued on Aug. 11, 2015 (titled "Side Opening Unified Pod"), the disclosure of which is incorporated herein by reference in its entirety. In one aspect, the transport chamber 130 has the same atmosphere (e.g., a vacuum atmosphere) as that of the front end of line process 140; while in other aspects the transport chamber has an atmospheric environment and the front end of line process 140 includes any suitable load lock for transferring substrates S between the front end of line process 140 and the transport chamber 130 without degradation of a processing atmosphere of the front end of line process 140.

Referring to FIG. 1B, the substrate processing apparatus 150 includes the load port 120 (similar to that described herein), the transport chamber 130 (similar to that described herein), and any suitable back end of line process 160 (e.g., generally associated with fabrication of metal interconnect layers of the semiconductor structures formed by the front end of line process 140 and includes any suitable processing steps after the front end of line process up to and including final passivation layer fabrication). The load port 120 is coupled to a transport chamber 130 and is configured to interface any suitable substrate carrier 110 to the transport chamber 130. The transport chamber 130 is coupled to the back end of line process 160 and includes any suitable opening and/or valves through which substrates are passed between the transport chamber 130 and the back end of line process 160. The transport chamber 130 includes substrate transport 180 (such as that described above) configured to transfer substrates between the carrier 110 and the back end of line process 160. The carrier 110 may be any suitable carrier 110 such as a front opening carrier (illustrated in FIGS. 1A and 1B—a suitable example of which is a front opening unified pod (FOUP)) or bottom opening carrier (a suitable example of which is a standard mechanical interface (SMIF) pod). In one aspect, the carrier 110 may be substantially similar to those described in U.S. Pat. No. 9,105,673 issued on Aug. 11, 2015 (titled "Side Opening Unified Pod"), the disclosure of which was incorporated herein by reference in its entirety. In one aspect, the transport chamber 130 has the same atmosphere (e.g., a vacuum atmosphere) as that of the back end of line process 160; while in other aspects the transport chamber has an atmospheric environment and the back end of line process 160 includes any suitable load lock for transferring substrates S between the back end of line process 160 and the transport chamber 130 without degradation of a processing atmosphere of the back end of line process 160.

Referring to FIG. 1C, the substrate processing apparatus 165 includes the load port 120 (similar to that described herein), the transport chamber 130 (similar to that described herein), and any suitable back end process 170 (e.g., generally including substrate test, substrate backgrinding, die separation, die tests, IC (integrated circuit) packaging, and final test). The load port 120 is coupled to a transport chamber 130 and is configured to interface any suitable substrate carrier 110 to the transport chamber 130. The transport chamber 130 is coupled to the back end process 170 and includes any suitable opening and/or valves through which substrates S are passed between the transport chamber 130 and the back end process 170. The transport chamber 130 includes substrate transport 180 (such as that described above) configured to transfer substrates between the carrier 110 and the back end process 170. The carrier 110 may be any suitable carrier 110 such as a front opening carrier (illustrated in FIGS. 1A and 1B—a suitable example of which is a front opening unified pod (FOUP)) or bottom opening carrier (a suitable example of which is a standard mechanical interface (SMIF) pod) as noted above. In one aspect, the carrier 110 may be substantially similar to those described in U.S. Pat. No. 9,105,673 issued on Aug. 11, 2015 (titled "Side Opening Unified Pod"), the disclosure of which was incorporated herein by reference in its entirety.

Figure 2A:
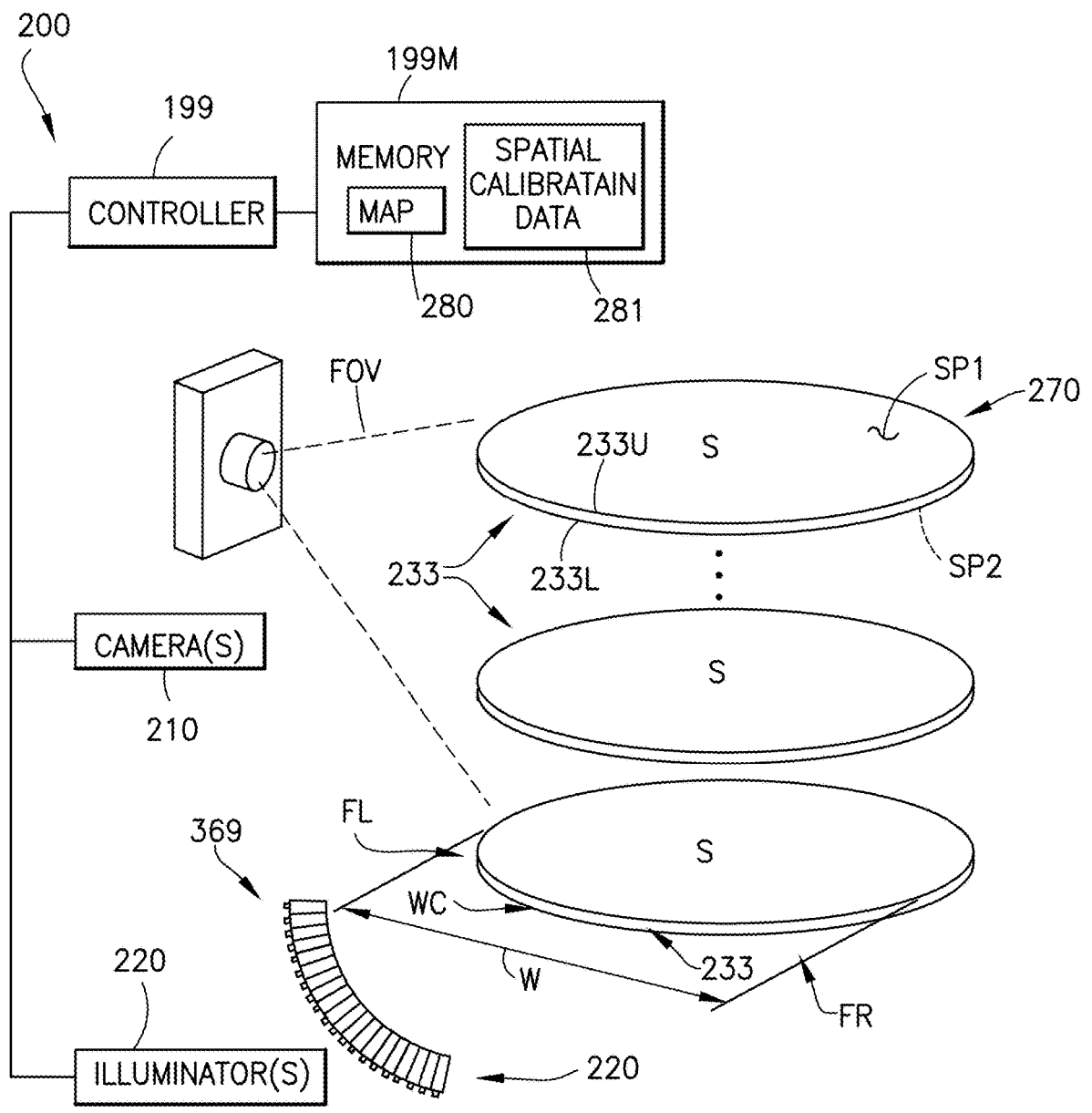
FIGS. 2A, 2B, and 2C are exemplary schematic illustrations of a machine vision system and illuminator(s) of the substrate processing apparatus of FIGS. 1A, 1B, and 1C in accordance with aspects of the present disclosure.
Figures 2B, 2C:
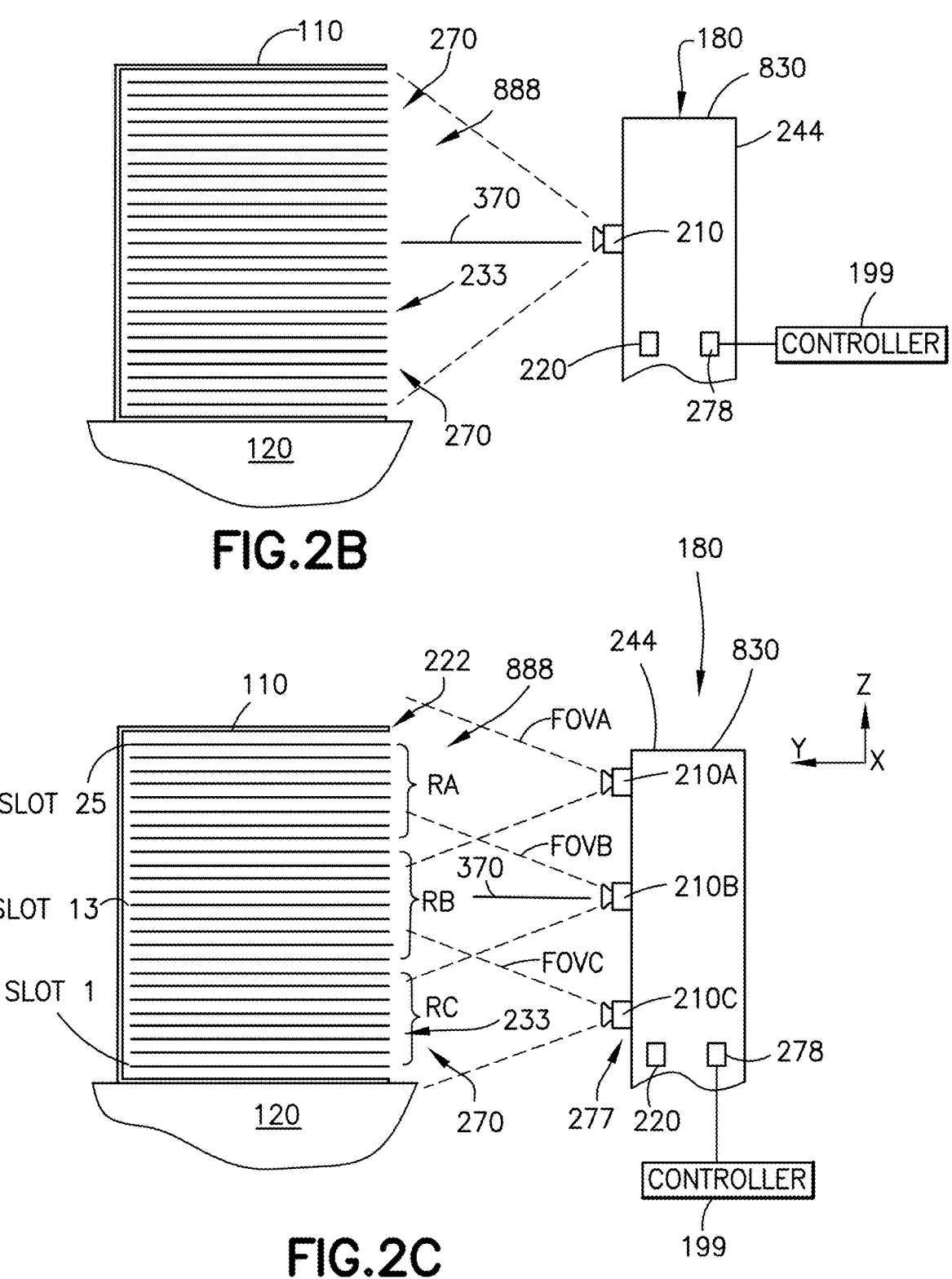

Referring to FIGS. 2A, 2B and 2C, the substrate mapping apparatus 181 will be described with respect to one substrate S or a stack of substrates 270 held in a substrate carrier 110 seated on and engaged with the load port 120; however, in other aspects the one substrate S or stack of substrates 270 may be disposed at any suitable location of the substrate processing apparatus 100, 150, 165 including, but not limited to, any suitable substrate buffers, substrate aligners, load locks, and any other location where one or more substrates S are held. As described above, the substrate mapping apparatus 181 includes at least one camera 210 and at least one illuminator 220 that are coupled to any suitable controller, such as controller 199 the substrate processing apparatus 100, 150, 165. The substrate S or stack of substrates 270 is/are illuminated by the at least one illuminator 220 as will be described herein so that the at least one camera captures at least one image of the substrate edge(s) illuminated by the at least one illuminator 220. Signals embodying the image are transmitted from the at least one camera 210 to the controller 199 for processing of the image and to extract (or otherwise determine) the map 280 from the image using any suitable image processing algorithms. The map 280 is stored in any suitable memory 199M of or accessible by the controller 199 so that the controller 199 can command movement of substrate transport equipment based on a state of the substrate S or each substrate in the substrate stack 270 as determined by the map 280. As will be described herein, in one or more aspects a single camera and illuminator pair is employed to image the substrate(s) S and determine the map, while in other aspects more than one camera and/or more than one illuminator are used. In some aspects, such as depending on a substrate type (e.g., thickness, shape, material, etc.) as well as an environment surrounding the substrate (e.g., located within a carrier 110, located within an unenclosed rack, etc.), more than one image of the substrate S or substrate stack 270 are taken and analyzed as described herein to determine the map 280. For exemplary purposes only, the description provided herein assumes only a single image is analyzed; however, as noted above more than one image can be compared, superposed, etc. and analyzed in a manner similar to that described herein without departing from the aspects of the present disclosure. Also for ease of explanation, the present disclosure is described with respect to analyzation of substrate stack 270; however, analyzation of a single substrate S is substantially similar to that described herein.

As will be described herein, the map 280 is determined or otherwise generated to determine the state of each substrate S in each holding slot of the substrate stack 270. An image of the substrate stack 270 is taken with the at least one camera 210 and at least one illuminator 220 in any suitable location(s) relative to the substrate stack 270 so that outer edges 233 of the substrates S in the substrate stack 270 are captured in the image (see, e.g., image 400 in FIG. 4). The image is processed by the controller 199 in any suitable manner, such as described herein, to identify the outer edges 233 of the substrates S, where at least a partial definition of the outer edge 233 is performed by the controller 199 based on the image.

Figure 5:
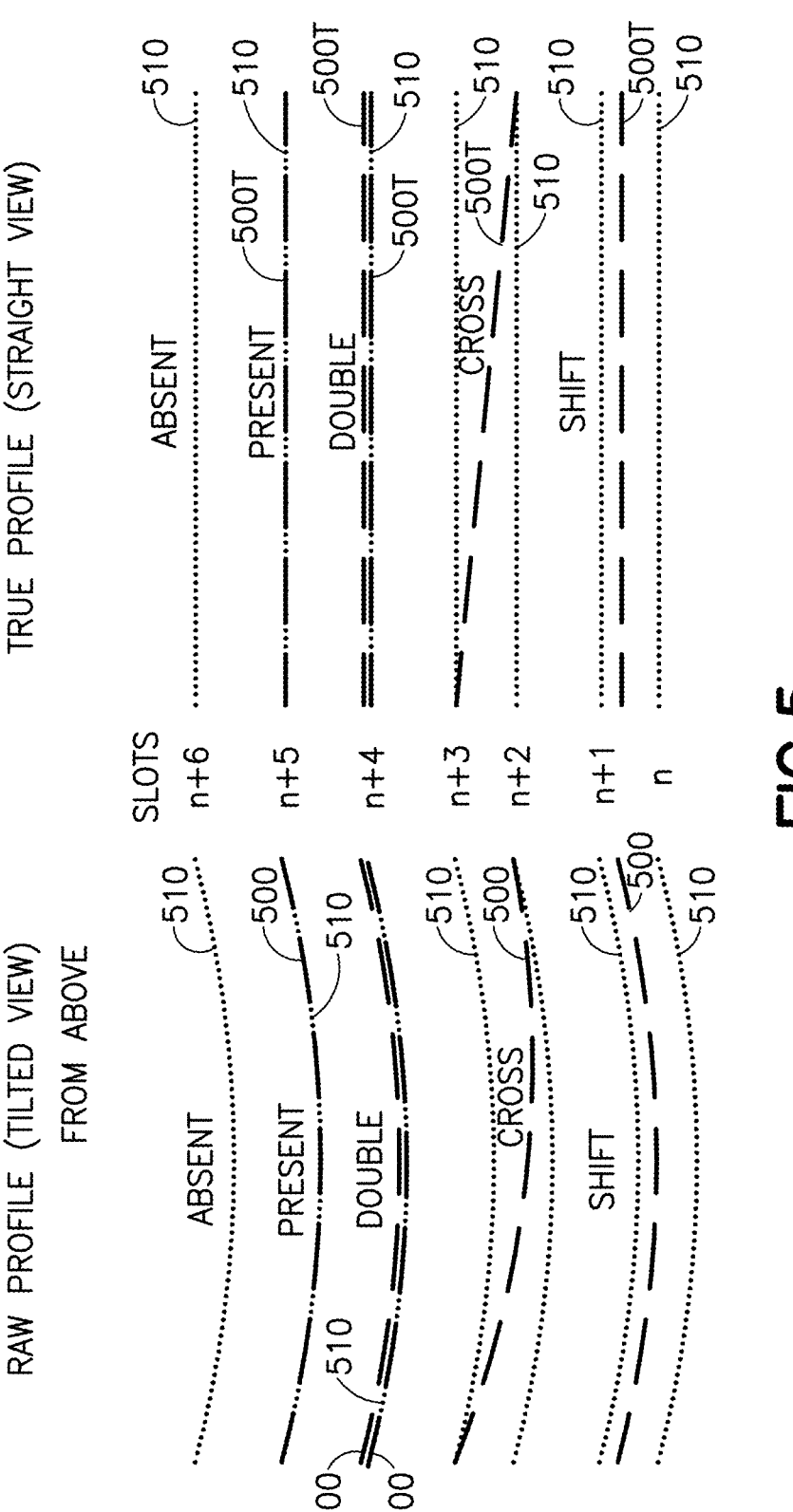
FIG. 5 is an exemplary comparison of a raw profile of imaged substrates imaged by the machine vision system of FIGS. 2A, 2B, and 2C and corresponding true profiles of the imaged substrates in accordance with aspects of the present disclosure.

As noted briefly above, and referring also to FIG. 5, for each holding slot of the substrate stack 270 (noting that the holding slot(s) (n, n+1, n+2, . . . ; each having a predetermined height relative to a load port reference location as provided for in SEMI® standards) is/are defined by the substrate carrier 110 or other substrate support and are arranged to support a respective substrate S in the substrate stack 270 with a predetermined distance or pitch between the substrates S) the edge data of each substrate S (see, e.g., FIG. 5) is determinative of the state of the substrate S in the holding slot based on the following exemplary substrate mapping rules:

where no substrate edge 500 (the substrate edge 500 in the image being the outer edge 233 of the substrate S in the stack of substrates 270) is detected in the image the state of the substrate S for any given holding slot is absent (i.e., no substrate is present);

where a single substrate edge 500 is detected in the image or a shape line (indicative of a substrate edge 500) is detected in the image as overlapping with a holding slot baseline 510 the state of the substrate S in any given holding slot is present (i.e., a single substrate is present in the holding slot);

where two substrate edges 500 are detected in the image or a thickness of the substrate S detected in the image is, for example, twice (or any suitable multiple of) an expected substrate thickness, the state of the substrate S in any given holding slot is double (i.e., two substrates S are disposed one on top of the other in the same holding slot);

where a shape line (indicative of a substrate edge 500) is not parallel to a baseline 510 of the holding slot the state of the substrate S in any given holding slot is cross (i.e., cross-slotted where one substrate is placed across two slots, such as slots n+2 and n+3 in FIG. 5);

where a shape line (indicative of a substrate edge 500) is parallel to a slot baseline 510 but shifted vertically (such parallelism being detectable when the at least one camera 210 views the substrate S from an angle (i.e., from above or below the substrate S) the state of the substrate S in any given holding slot is shifted or tilted (i.e., the substrate has slid out of its nominal position within the holding slot).

It is noted that the state of each substrate S in each holding slot together form the map 280.

Referring to FIGS. 2A, 2B, 2C and 3A, in accordance with aspects of the present disclosure, the at least one camera 210 is mounted in one or more of a near plane 300 and a far plane 301. The near plane 300 is adjacent the substrate carrier 110 (e.g., seated on the load port 120) while the far plane 301 is further away from the substrate carrier 110. The near plane 300 is any suitable distance Y1 that is nearest the opening 399 of the substrate carrier 110 with all of the substrates S stacked within the substrate carrier 110 captured in and substantially fill a field of view FOVW of the camera 210 fitted with the wide angle lens (see FIG. 3C). The far plane 301 is any suitable distance Y2 that is nearest the opening 399 of the substrate carrier 110 with all of the substrates S stacked within the substrate carrier 110 captured in and substantially fill a field of view FOVT of the camera 210 fitted with a telephoto lens (FIG. 3D). As may be realized, the distances Y1, Y2 can be determined based on a height of the substrate stack 270 and a focal length of the respective wide angle lens and telephoto lens. In accordance with the present disclosure, the mounting location of the at least one camera 210 in the X direction is substantially along a vertical (Z-axis) centerline 371 of the substrate stack 270 (not shown in FIG. 3A for clarity but is substantially coincident with a vertical centerline of the substrate carrier 110); however, in other aspects the at least one camera 210 can be mounted on one or more sides (e.g., to the left or right) of the vertical centerline 371. The mounting location of the at least one camera 210 in the Z direction may be substantially in-line with a horizontal center plane 370 (the X-Y plane) of the substrate carrier 110; however, in other aspects the at least one camera 210 can be mounted above or below the center plane 370. FIG. 2B illustrates a single camera 210 mounted in-line with the horizontal center plane 370 while FIG. 2C illustrates a camera 210B mounted at the horizontal center plane 370, a camera 210A mounted above the horizontal center plane 370, and a camera 210C mounted below the horizontal center plane 370 (noting that FIGS. 2B and 2C are generic with respect to near plane 300 and far plane 301). In other aspects more or fewer cameras may be used. The one or more cameras described herein are generally referred to as at least one camera 210 (which is inclusive of a single camera or a system/array of cameras 210A, 210B, 210C, etc.).

In one or more aspects, at least one of the at least one camera 210 is mounted at the lower center location LC so as to image the substrate stack 270 in an angled upwards direction. In lower center location LC the resulting image substantially eliminates background noise due to, for example, environmental reflections (such as from the interior of the carrier 110) and/or top surfaces of the substrates which may include the die grip patterns. Here the substrates are illuminated from one or more of the locations (e.g., upper left UL, upper center UC, upper right UR, middle left ML, middle center MC, middle right MR, lower left LL, lower center LC, and lower right LR). In one or more aspects, at least one of the at least one camera 210 is mounted at the upper center location UC where the substrate stack is illuminated from one or more of the lower locations LL, LC, LR and middle locations ML, MC, MR so that at least background noise from or imaging of the top surface of the substrate is suppressed (e.g., the top surfaces of the substrate are cast in shadow in a manner similar to that described in U.S. patent application Ser. No. 16/570,453 filed on Sep. 13, 2019 and titled "Method and Apparatus for Substrate Alignment," the disclosure of which is incorporated herein by reference in its entirety). In one or more aspects, at least one of the at least one camera 210 is mounted at the middle center location MC where the substrate stack 270 is illuminated from one or more of the lower locations LL, LC, LR to suppress at least background noise from or imaging of the top surface of the substrates S. In still other aspects, the at least one camera 210 may be located at any number and combination (such as where the at least one camera 210 comprises more than one camera) of the mounting locations UL, US, UR, ML, MC, MR, LL, LC, LR on the near plane 300 and/or far plane 301; however, where the at least one camera 210 is mounted at the middle center location MC on the near plane 300 the at least one camera 210 is mounted to a load port door 120D of the load port so that the at least one camera is moved with the load port door from a substrate transfer path to and from the substrate cassette 110. Here, the at least one camera 210 images the substrate stack 270 (with one or more images) as the load port door 120D moves to open and close the load port/substrate carrier.

Referring to FIGS. 1A-1C and 2C, the at least one camera 210 is mounted to a fixed location within an interior of the substrate processing apparatus 100, 150, 165 (so as to be stationary with respect to the substrate stack 270) (See FIGS. 1A-1C). The at least one camera 210 can also be mounted to a movable component (e.g., the load port door 120D and/or substrate transport 180) of the substrate processing apparatus 100, 150, 165 (See FIGS. 1A-1C). Here the movable component positions the at least one camera 210 in the desired location UL, US, UR, ML, MC, MR, LL, LC, LR on the near plane 300 and/or far plane 301 for imaging the substrate stack 270. FIG. 2C illustrates an example, where the camera array 277 including more than one camera 210A, 210B, 210C is located on the substrate transport 180. Here, the camera array 277 is located on a common support 244 (which in this aspect is the Z-drive column 830) of the substrate transport 180 (where the "common support" refers to a single support to which each camera in the camera array 277 is mounted so that the cameras share the single support); however, in other aspects, where stationarily mounted in the transfer chamber 130 the camera array 277 may be mounted to any common support of the substrate processing apparatus 100, 150, 165, and where movably mounted the camera array can be mounted to any movable structure of the substrate processing apparatus 100, 150, 165. Each camera 210A, 210B, 210C is fixed to (or fixed with respect to) the common support 244. The common support 244 is static with respect to each camera 210A, 210B, 210C of the camera array 277 (i.e., there is no relative movement between the cameras 210A, 210B, 210C and the common support).

In one aspect, any suitable camera controllers 278 are located on the substrate transport 180 and are coordinated by any suitable controller, such as controller 199; while, in other aspects the camera controllers 278 are incorporated into controller 199. In one or more aspects, the at least one illuminator 220 is mounted to the substrate transport 180 or in a stationary location within the substrate processing apparatus 100, 150, 165.

Where the at least one camera 210 and, in some aspects, the at least one illuminator 220 is/are mounted to the substrate transport 180, the substrate transport 180 transports the at least a portion of the machine vision system 200 to any desired location within the substrate processing apparatus 100, 150, 165 at which a substrate stack 270 is held. Mounting the at least one camera 210 and, in some aspects, the at least one illuminator 220 to the substrate transport 180 may decrease the number of cameras and illuminators (such as where the substrate processing apparatus 100, 150, 165 has multiple load ports at which substrate carriers 110 are held and substrate stacks 270 are mapped) and may provide for optimal positioning (e.g., unobstructed fields of view on the near plane 300 and/or far plane 301 at any one or more of the locations UL, US, UR, ML, MC, MR, LL, LC, LR) of the at least one camera 210 and at least one illuminator 220 regardless of the construction of the robotic environment (i.e., the interior of the substrate processing apparatus 100, 150, 165).

In the example illustrated in FIG. 2C (see also FIGS. 8A and 8B), each respective camera 210A, 210B, 210C is disposed on the Z-drive column 830 of the substrate transport 180 so that the fields of view FOVA, FOVB, FOVC extend in a direction parallel to or along the center plane 370 of the substrate carrier 110 (e.g., perpendicular to an extension axis of the substrate transport end effector). Here the fields of view FOVA, FOVB, FOVC are positioned on the Z-drive column 830 (i.e., the common support 244) to view, through the opening 888 with the Z-drive column 830 positioned by the transfer arm 180TA (FIG. 8A) at a common position CP (see FIG. 8B—where the "common position" refers to a single position of the substrate transport so that the cameras 210A, 210B, 210C mounted to the common support 244 are dependent from the single position of the common support 244) relative to the opening 888, a different separate part (see, e.g., regions RA, RB, RC in FIG. 2C, and a representative region of interest (i.e., any one of the regions RA, RB, RC) in FIG. 6E) of the substrate carrier 110. Each different separate region RA, RB, RC has substrate slots for holding at least one or more than one substrates S, separate and different from parts of the substrate carrier 110 with different substrate holding slots for holding substrates S different than the at least one or more than one substrates S in regions/parts viewed by each other camera 210A, 210B, 210C with the Z-axis drive 830 at the common position CP. Each substrate S held in the substrate carrier 110 is imaged by camera array 277 with the Z-axis drive 830 at the common position CP. In some aspects, each of the corresponding different separate parts is imaged by but one respective camera 210A, 210B, 210C of the camera array 277 (although the fields of view may overlap the images may be cropped so that each of the corresponding different separate part is imaged by but one respective camera 210A, 210B, 210C; while in other aspects the fields of view do not overlap). In some aspects, at least one substrate S held in the corresponding wafer slot of the corresponding different separate part is imaged by but one of the respective camera 210A, 210B, 210C of the camera array 277 (again noting that although the fields of view may overlap the images may be cropped so that each of the corresponding different separate part is imaged by but one respective camera 210A, 210B, 210C; while in other aspects the fields of view do not overlap). Here, the controller 199 is communicably coupled to the transport arm 180TA to move the transport arm 180TA relative to the frame 800 (see FIG. 8) and position the common support 244 at the common position CP.

Each different separate part of the substrate carrier 110 and substrate stack 270 therein viewed by the respective camera 210A, 210B, 210C of the camera array 277, has a different set of wafer slots, corresponding to the separate part and the respective camera 210A, 210B, 210C, vertically distributed at predetermined reference heights viewed by the respective camera 210A, 210B, 210C. The predetermined reference heights are those corresponding to the different holding slot numbers (in this example, for a 25 slot substrate carrier) established by SEMI® standards for substrate carriers from, for example, a reference location of the load port 120 on which the substrate carrier 110 is seated. For example, each field of view FOVA, FOVB, FOVC of the respective camera 210A, 210B, 210C captures respective region of interest RA, RB, RC of an interior 222 of the substrate carrier 110 (and of the substrate stack 270 therein). In one or more aspects, an image captured by each respective camera 210A, 210B, 210C of the corresponding different separate part excludes each other different separate part viewed by each other respective camera 210A, 210B, 210C, and each substrate in each slot in the substrate carrier 110 is imaged by the camera array 277 with the common support 244 at the common position CP. In this example, the substrate carrier 110 is a 25 substrate carrier and region of interest RC corresponds to holding slots 1-8, region of interest RB corresponds to holding slots 9-17, and region of interest RA corresponds to holding slots 18-25. The fields of view FOVA, FOVB, FOVC may overlap any desired amount to provide substantially complete coverage of the interior 222 (which in some aspects may increase the amount of image information and increase resolution of the resulting map 280); while in other aspects, as described herein, the fields of view may not overlap or be cropped for image processing. In this aspect, image processing is performed as described herein for each image captured by respective camera 210A, 210B, 210C where the controller 199 combines the respective processed images to generate the map 280 of the substrate stack 270 within the substrate carrier 110.

While the cameras 210A, 210B, 210C in FIG. 2C are illustrated one above the other (e.g., in locations UC, MC, LC) in other aspects, (which also apply to stationarily mounted cameras) may be mounted in any number of the locations UL, US, UR, ML, MC, MR, LL, LC, LR so as to form one dimensional vertical (in the Z direction) camera arrays, one dimensional horizontal (e.g., in the X direction) camera arrays, or a two dimensional arrays of cameras (e.g., in the X-Z plane). As may be realized, generally for round shaped substrates, the far left side FL and far right side FR (see FIG. 2A) of the substrates when viewed through the opening 888 may be dimmer in illumination as the substrate outer edge 233 curves away from the at least one camera 210. Where the edge signal obtained by the at least one camera 210 falls below any suitable predetermined threshold, additional images of the substrates can be taken with longer exposure times and/or with a larger camera aperture. As may be realized, the longer exposure times and/or larger aperture may cause overexposure of a center region WC of the substrate in the image, where several images (low exposure and high exposure images) are combined using any suitable image processing algorithms including, but not limited to, high dynamic range (HDR) algorithms, or combining different vertical segments of the different images to produce a resulting image that has a uniform exposure that highlights the substrate edges 233. As such, cameras located in different ones of the locations UL, US, UR, ML, MC, MR, LL, LC, LR may be programmed with different aperture sizes and or exposure speeds that are optimized for different regions of the substrate stack/substrate carrier. For example, cameras closer to the at least one illuminator 220 may have a slower exposure speed and/or smaller aperture than cameras further from the at least one illuminator 220 so as to substantially prevent overexposure of the image which may prevent substrate edge detection. As may be realized, the exposure speeds and/or aperture sizes of the cameras in the different locations may be determined such that the resulting combined image has a consistent exposure and contrast of features in the image substantially throughout the image (see FIG. 4A).

Figure 3A:
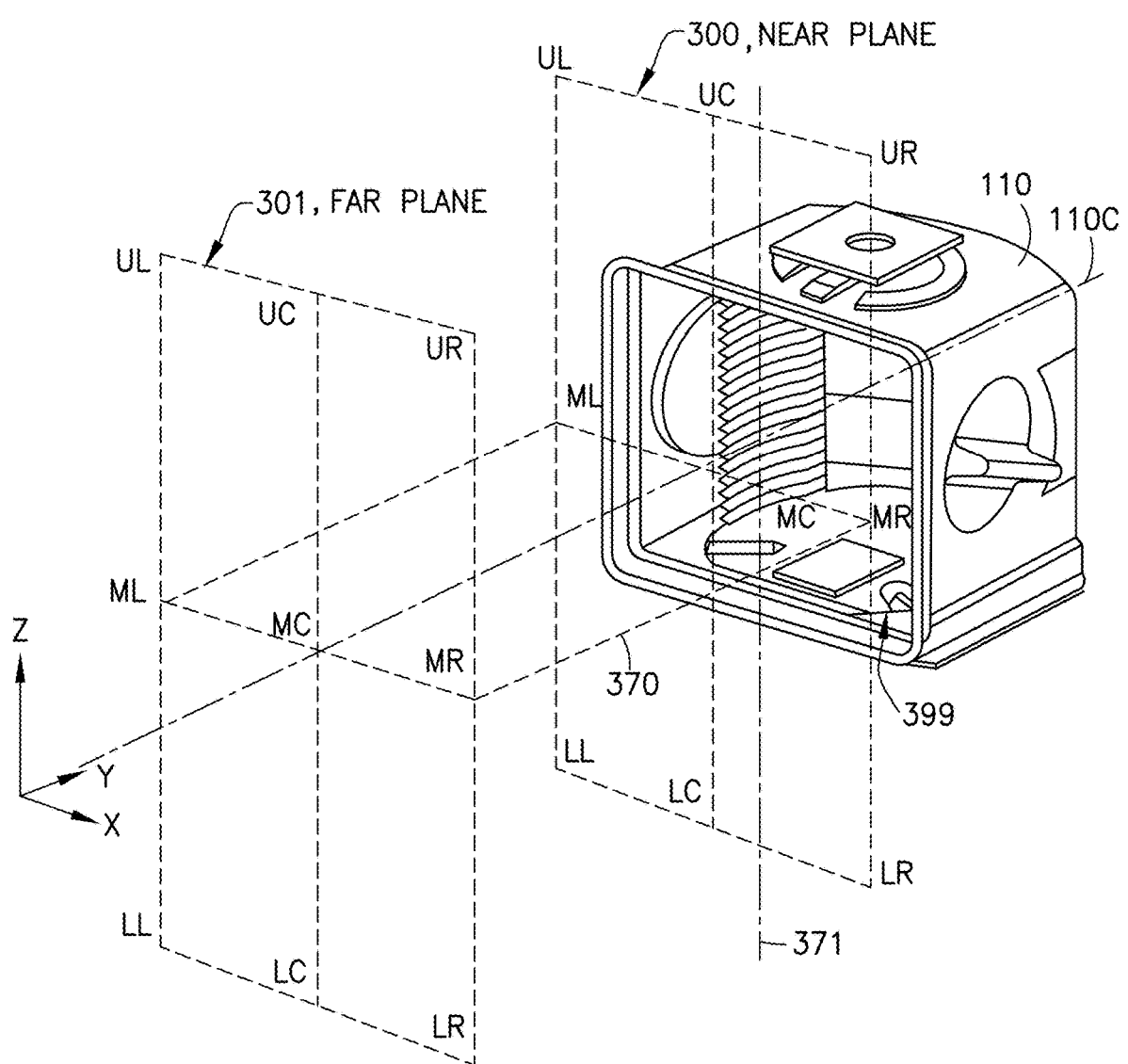
FIGS. 3A, 3B, 3C, and 3D are exemplary schematic illustrations of portions of the machine vision system and illuminator(s) of FIGS. 2A, 2B, and 2C in accordance with aspects of the present disclosure.
Figure 3B:
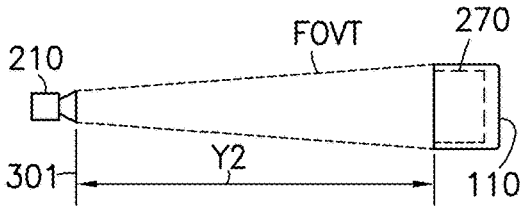
Figure 3C:
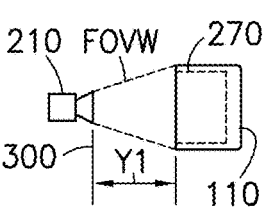
Figure 3D:

Referring to FIGS. 2A, 3B, and 7, the substrates S are illuminated by at least one illuminator 220 (also referred to herein as an illumination source) and the images are captured by the at least one camera 210 in a manner such that the signal in the image corresponding to the substrate edge 500 is maximized and the signal in the image corresponding to the background (including the environment surrounding the substrate S, the top/bottom of the substrate S, any die grid pattern on the substrates S, etc.) is minimized to, for example, produce a high contrast image that emphasizes the edge 500. One example, of high contrast imaging is described in U.S. patent application Ser. No. 16/570,453, previously incorporated herein by reference. As will also be described herein, the at least one illuminator is configured to provide diffused illumination across a width W of the each substrate(s) S (when viewed from a minor side of the substrate—see, e.g., FIG. 4A where the width W is a visible width of the substrate(s) S held in a substrate holding location). As may be realized, the at least one illuminator 220 may be positioned within the substrate processing apparatus 100, 150, 165 in a manner substantially similar to that described herein with respect to the cameras 210, 210A, 210B, 210C.

As an example, referring to FIGS. 2A, 2B, 2C, 3B, and 8A, the at least one illuminator 220 is connected to the common support 244 and is/are configured to illuminate, through the opening 888 with the common support 244 in the common position CP, an outer edge 233 (see FIGS. 2A-2C) (the term "outer" being with respect to the substrate carrier 110 and refers the a portion of the substrate edge that is visible through the opening 888) of each substrate S in the substrate carrier 110. The outer edge 233 delineates upper and lower edge boundaries 233U, 233L (see FIG. 2A) of the outer edge 233 of the respective substrate S. The at least one illuminator 220 is disposed with respect to each camera 210, 210A, 210B, 210C so that the outer edge 233 directs reflected edge illumination, from the at least one illuminator 220, at the camera 210, 210A, 210B, 210C, and optically blanks, at the upper edge boundary 233U and the lower edge boundary 233L, background reflection light, viewed by each camera 210, 210A, 210B, 210C through the opening 888 with the common support 244 at the common position CP. The at least one illuminator 220 is disposed relative to a respective camera 210A, 210B, 210C so that reflected light from planar surfaces SP1, SP2 (e.g., the top and bottom major planar surfaces) of the substrate S and each other substrate S slotted in (or otherwise held in) the substrate carrier 110 are optically blanked in each image (see for example, the image illustrated in FIGS. 4A and 6B-6E) by the respective camera 210A, 210B, 210C of the different separate part of the substrate carrier 110. For example, the region of interest in FIG. 6E is illustrative of any one or more of regions RA, RB, RC in FIG. 2C (see also FIGS. 16A and 16B) where the image from each camera 210A, 210B, 210C images (although the field of view may be larger than the captured image) a portion of the respective field of view FOVA, FOVB, FOVC in which the reflected light from the planar surfaces SP1, SP2 of the substrate S (and any background of the carrier) and each other substrate S in the substrate carrier 110 are optically blanked. Here, the outer edge 233 of the substrate S defines or otherwise delineates the upper and lower edge boundaries 233U, 233L in relief in image contrast (see, e.g., FIGS. 6A-6C), formed by and between the edge reflection and the optically blanked background, registered by each camera 210, 210A, 210B, 210C so as to effect edge detection of each substrate S in the substrate carrier 110 with the common support 244 at the common position CP.

As illustrated in FIGS. 2A and 3B, in one aspect, the at least one illumination source 220 is at least one shaped line of illumination 369. In the examples illustrated, the shaped line of illumination 369 is disposed in the near plane 300 in one or more of the upper and lower locations; however, in other aspects the shaped line of illumination 369 can be disposed in the far plane 301 in one or more of the upper and lower locations or in the middle location of one or more of the near plane 300 and far plane 301. The shaped line of illumination 369 has a shape that corresponds with the outer edge 233 of the substrates S held within the substrate carrier 110; however in other aspects the shaped line of illumination 369 may have any suitable shape for illuminating the substrates S in the manner described herein.

Figure 8A:
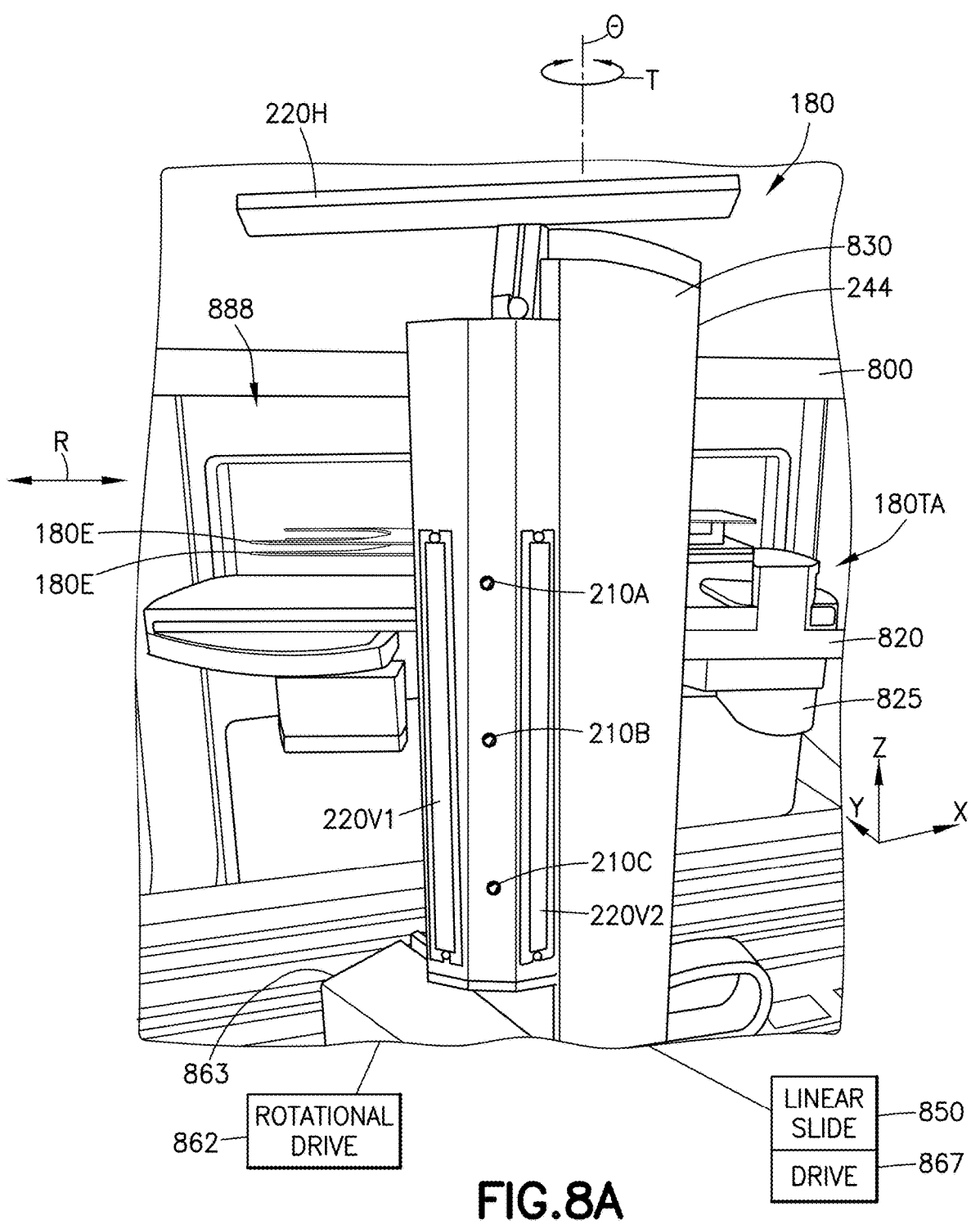
FIG. 8A is a schematic illustration of an exemplary transport arm of the substrate processing apparatus of FIGS. 1A, 1B, and 1C in accordance with aspects of the present disclosure.
Figure 8B:
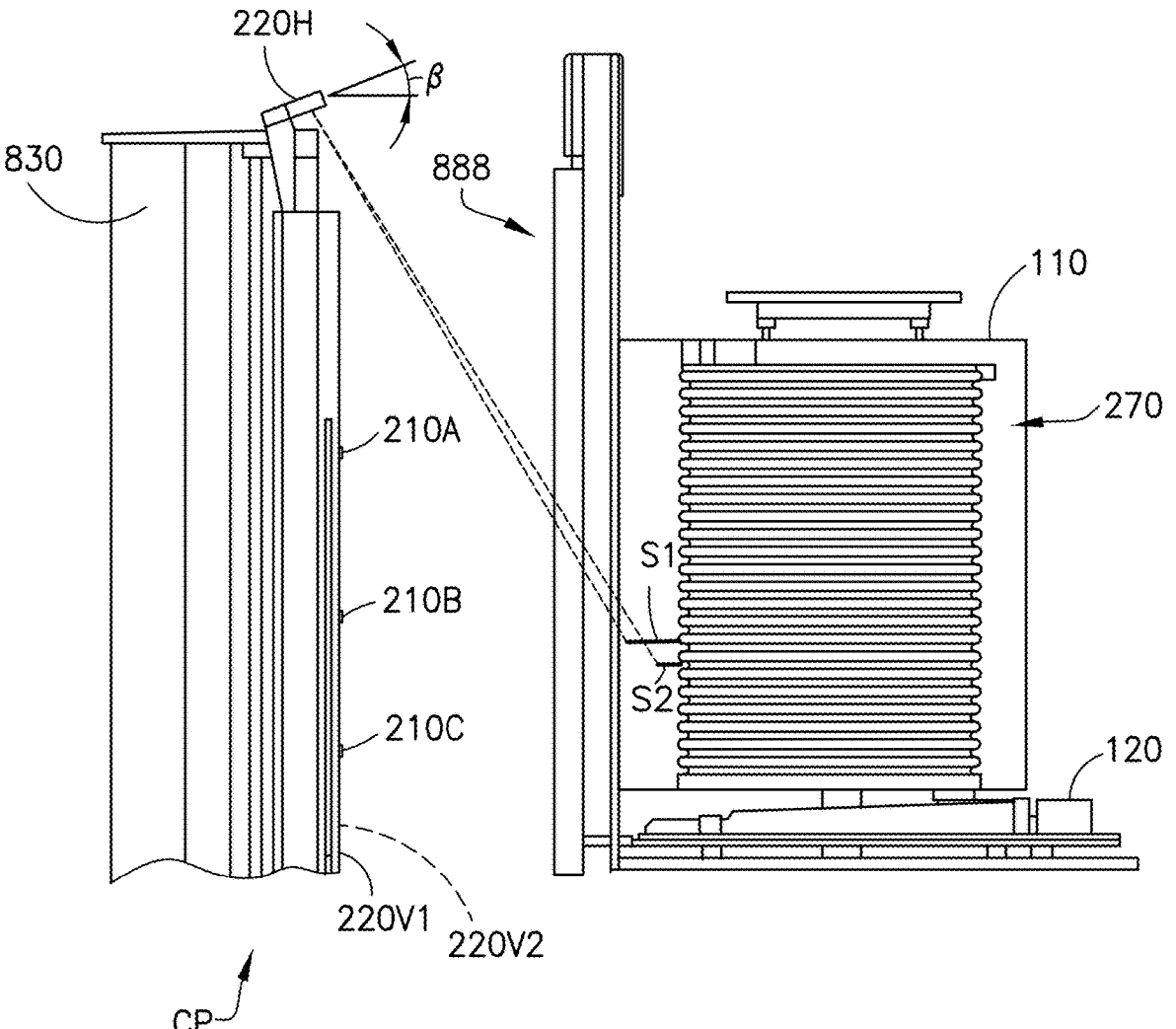
FIG. 8B is a schematic illustration of an exemplary light path of one or more of the illuminator(s) of the transport arm of FIG. 8A in accordance with aspects of the present disclosure.

Referring to FIGS. 8A and 8B, the at least one illuminator 220 includes at least one vertically (Z-axis) oriented illuminator 220V1, 220V2 and at least one horizontally (in the X-Y plane) oriented illuminator 220H. Here the cameras 210A, 210B, 210C (though three are shown, there may be 2 or more cameras, imaging two or more different separate carrier regions) are arranged in the upper center location UC, middle center location MC and lower center location LC (see FIGS. 3A and 3B) and are straddled by two illuminators 220V1, 220V2 that extend respectively from the upper right location UR to the lower right location LR and from the upper left location UL to the lower left location LL so as to form two straight lines of illumination. The illuminator 220H is located above the cameras 210A, 210B, 210C so as to illuminate the outer edge 233 of each substrate S from any suitable angle β (in the example illustrated in FIG. 8B the angle β is relative to the X-Y plane but in other aspects the angle may be relative to the Z axis). Here, the illuminator 220H is positioned to illuminate the substrates S so that the cameras 210A, 210B, 210C detect substrates S1 that are slid out from the carrier 110 while the illuminators 220V1, 220V2 illuminate the outer edges 233 in a manner so as to substantially prevent or otherwise blank background reflections (e.g., from the interior of the carrier, the top of the substrates, or the bottom of the substrates).

Figures 7A, 7B:
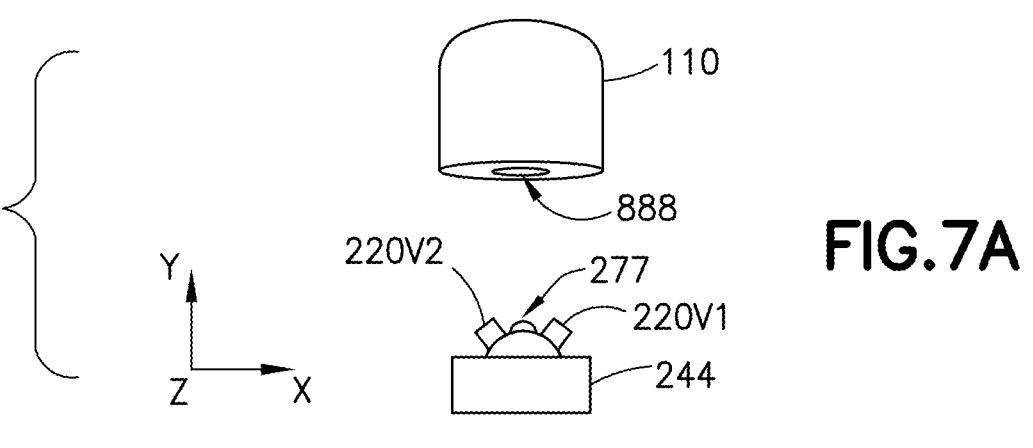
FIG. 7A is an exemplary illustration of the illuminator(s) of FIGS. 2A, 2B, and 2C in accordance with aspects of the present disclosure.
FIG. 7B is a schematic illustration of an exemplary light path of one or more of the illuminator(s) of FIG. 7A in accordance with aspects of the present disclosure.

In one aspect, referring also to FIGS. 7A and 7B, the illuminators 220V1, 220V2 are arranged to direct diffuse light in any suitable direction (i.e., at any suitable angle) in the X-Y plane for illuminating the edges 233 of the substrates S through the opening 888 (see FIG. 7A). For exemplary purposes, as illustrated in FIG. 7B, the illuminators 220V1, 220V1 are arranged to shine the diffuse light in one or more directions that are oblique to a plane 888P of the opening 888. In the example shown the illuminators shine the light in a direction that is angled outward relative to a centerline 110C of the substrate carrier 110 by any suitable angle α. In the example, shown the angle α is the same for both illuminators 220V1, 220V2; however, in other aspects the angle α for illuminator 220V1 may be different than the angle α for illuminator 220V2. Here, the light from the illuminators 220V1, 220V2 is arranged vertically so that the light reaches substrates S in all of the substrate holding slots of the substrate carrier 110 and is not blocked by vertically adjacent substrates. In this aspect, the light from the illuminators 220V1, 220V2 is directed towards reflective surfaces 750, 751 within the transfer chamber 130 so that the light is reflected (now indirect light) onto the edges 233 of the substrates S by the reflective surfaces 750, 751 to substantially eliminate reflections from the interior of the substrate carrier 110 as seen by the cameras 210A, 210B, 210C. In other aspects the illuminators 220V1, 220V2 are provided with diffusers or other light scattering devices that provide indirect or diffuse light to the substrate edges 233 in a manner that substantially eliminates reflections from the interior of the substrate carrier 110 as seen by the cameras 210A, 210B, 210C. The resultant effect imaged by each of the cameras 210A, 210B, 210C in the corresponding different separate regions/parts RA, RB, RC, is that the substrate edge reflection optically blanks the background defining the boundaries of each substrate edge in relief in image contrast.

The illuminators 220, 220V1, 220V2, 220H, 369 are, in one or more aspects, coupled to the controller 199 so as to be dynamically controlled (e.g., turned on and off) and/or adjusted (e.g., in intensity). The controller 199 is configured to cycle one or more of the illuminators 220, 220V1, 220V2, 220H, 369 or a portion(s) thereof so as to separately or in combination illuminate different portions of the substrate stack 270 (e.g., separate illuminate the top section, the bottom section, the middle section, or any combination thereof such as substantially simultaneously illuminating both the top and middle sections, both the top and bottom sections, or illuminate one or more of the different sections in any suitable sequence where the sections are illuminated either separately or in combination) being imaged. The controller 199 is configured to maintain an intensity of illumination from one or more of the illuminators 220, 220V1, 220V2, 220H, 369 as static (e.g., a substantially constant intensity) or dynamically vary the intensity. Where the intensity of one or more of the illuminators 220, 220V1, 220V2, 220H, 369 is dynamically varied the intensity may vary along the X direction, the Y direction, and/or the Z direction of the illuminators 220, 220V1, 220V2, 220H, 369, including on different illumination intensity on different sides of the cassette 110. In one or more aspects, the dynamic variation in intensity may be regular (e.g., in a regular sequence such as high-low where the illumination is high at a reference line (e.g., baseline) for each slot of the cassette 110 and decreases (e.g., low) away from the slot reference line, for each reference line. In other aspects, the illumination may be dynamically varied irregularly such as high-high-high-low at respective slot reference lines in a series of slot reference lines. Further, different types of light spectrum may be employed by the different illuminators 220, 220V1, 220V2, 220H, 369 (e.g., infrared, visible white, visible color, etc.) to enhance image contrast. Each illuminator 220, 220V1, 220V2, 220H, 369 may be controlled by the controller 199 independently for one or more of intensity and light spectrum.

Figure 6A:
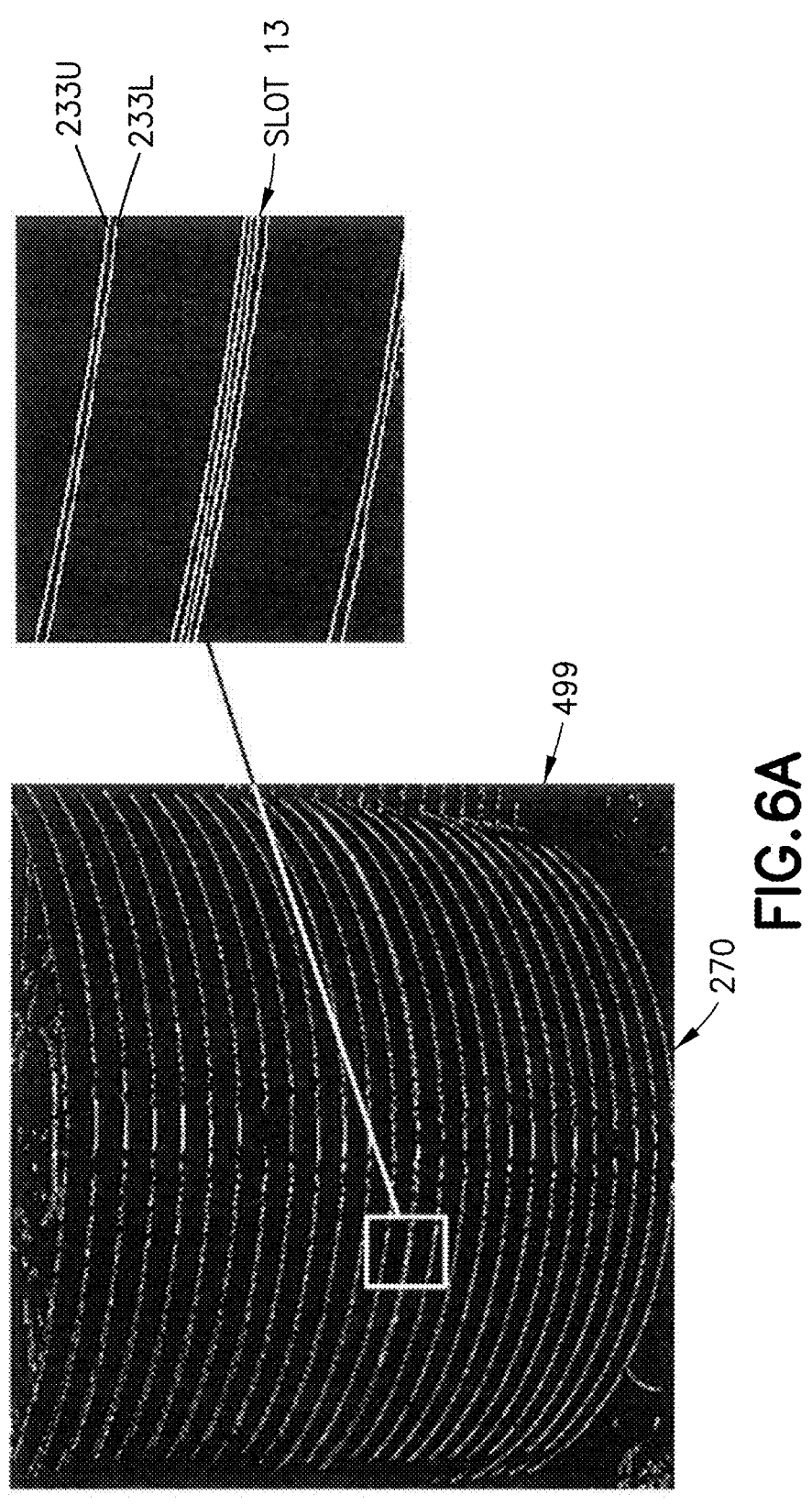
FIG. 6A is an exemplary image of a stack of substrates with upper and lower edges boundaries of the substrates and background optically blanked in accordance with aspects of the present disclosure.

Referring now to FIGS. 5, 4A, 4B, and 6A, the images (e.g., a final image, original image, or re-combined image) is processed by the controller 199 to define the edge profile of the outer edges 233. As may be realized, any suitable image processing can be applied to the images to enhance contrast of the outer edges 233 of the substrates 233 relative to background. Examples of image processing that can be applied to the images to enhance contrast include, but are not limited to, grey scale filters, contrast stretching, and intensity transition edge filters. An example application of an intensity transition edge filter is provided in FIG. 6A, where each outer edge 233 is identified with two intensity transitions (e.g., representing the upper and lower edge boundaries 233U, 233L of each substrate). As can be seen in FIG. 6A two substrates disposed one top of the other (i.e., the "double" state) are located in substrate holding slot 13 of the substrate carrier 110.

The substrate edge profiles are produced (through any suitable edge construction/image processing algorithm(s)) in a raw view/profile. The spatial correction algorithm is applied to the raw profiles using the spatial calibration data to produce the true substrate edge profiles (employed by the controller when commanding position of the end effector 180E for picking substrates S) that are independent of a position of the at least one camera 210. Here, multiple camera optical recognition systems (such as described herein) produce substantially identical true profiles 500T from the different raw profiles in the images taken by the different cameras.

Figure 4A:
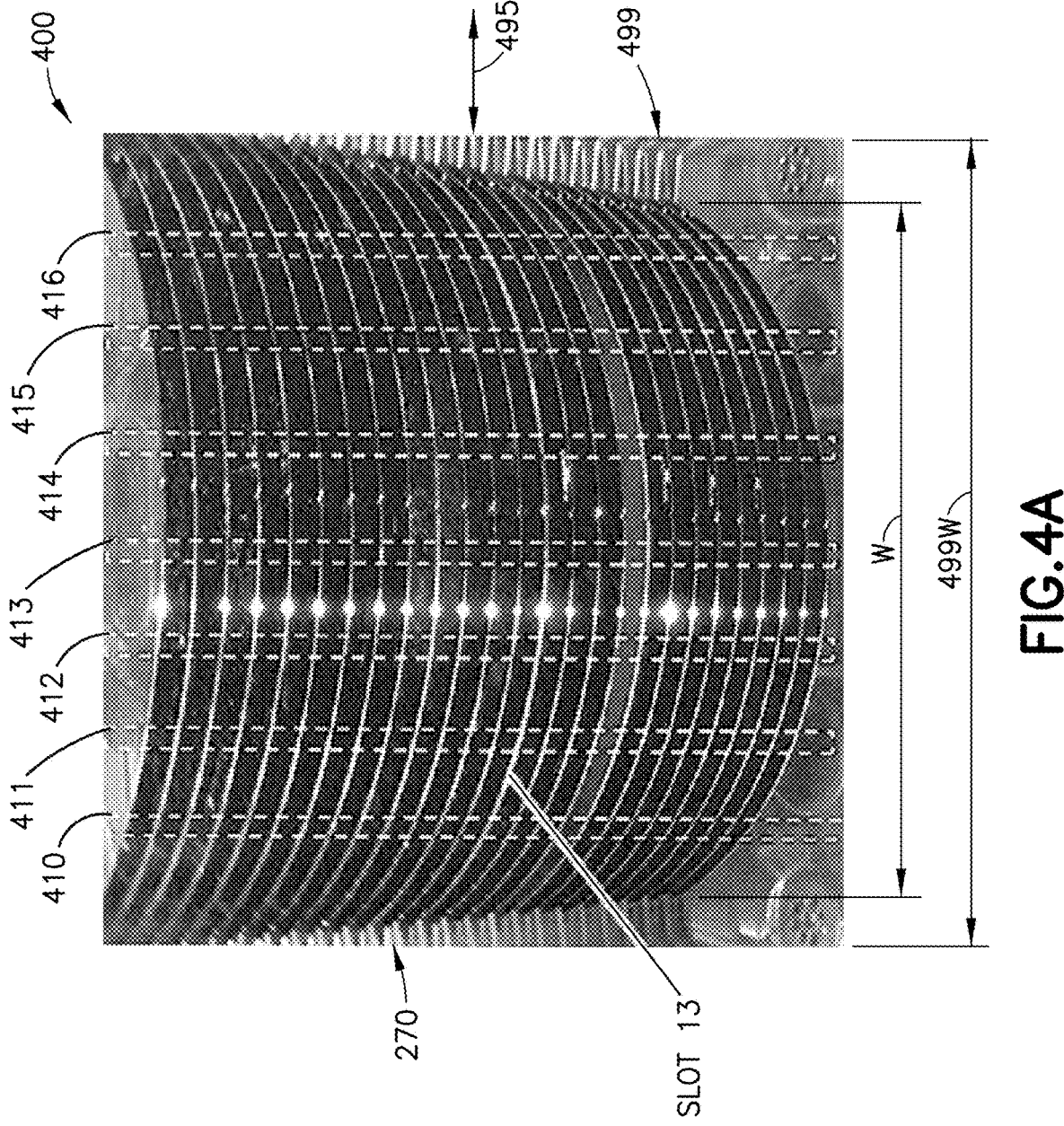
FIG. 4A is an exemplary image of substrates captured by the machine vision system of FIGS. 2A, 2B, and 2C in accordance with aspects of the present disclosure.
Figure 4B:
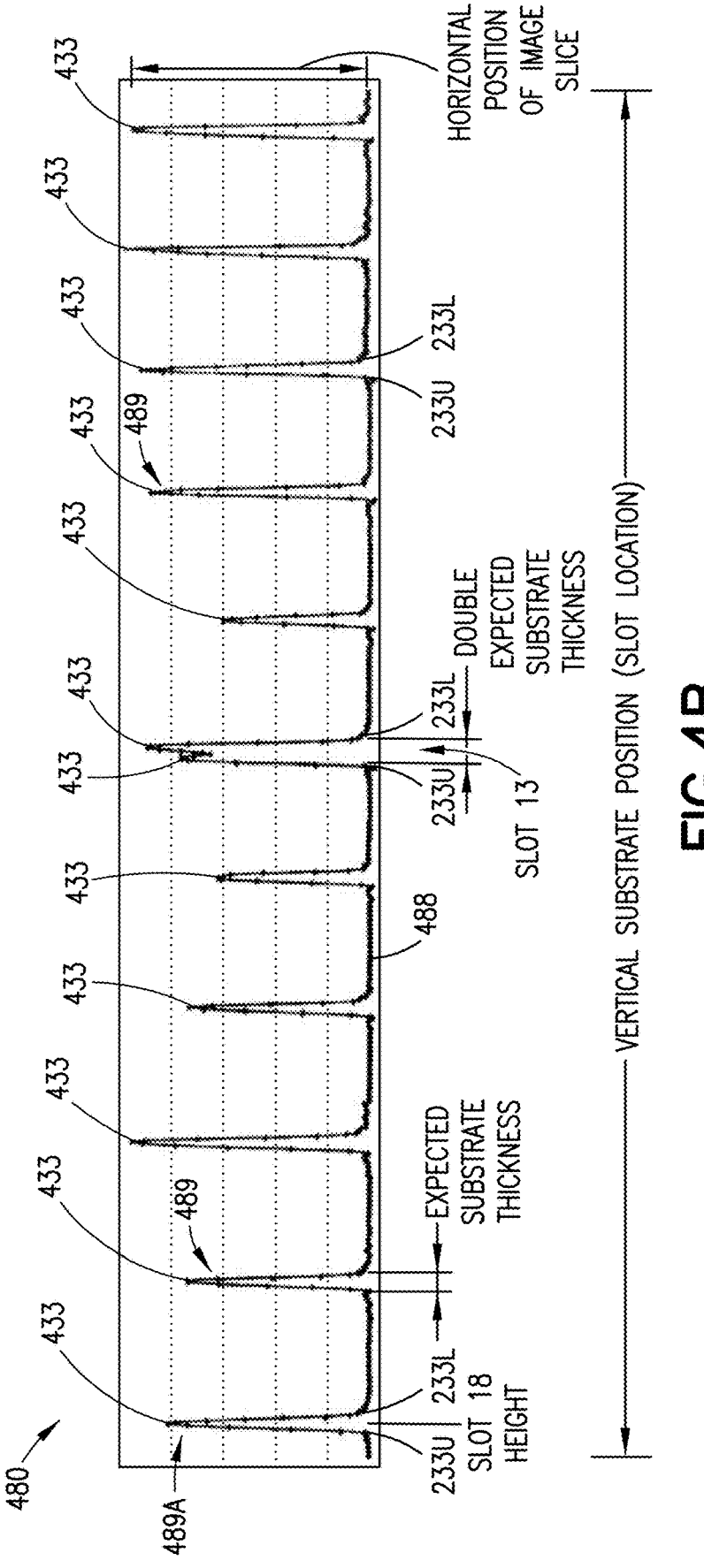
FIG. 4B is an exemplary intensity profile of the image of FIG. 4A in accordance with aspects of the present disclosure.

The edge defining algorithm programmed into the controller 199 is the same for substrate mapping and edge profile defining. In one or more aspects, vertical image slices 410-416 of an image are analyzed to detect the outer edge 233. Substrate mapping may be performed with one or more of the vertical slices 410-416, where edge profile defining is performed with more than one of the vertical slices 410-416. It is noted that seven vertical slices are illustrated in FIG. 4A for exemplary purposes only and in other aspects more or less than seven slices (or two or three slices) may be employed. To define the edges 233 of the substrates S for mapping and edge profiling an image 499 is sliced into the vertical slices 410-416, which are narrow vertical strips of the image 499 taken at predetermined locations relative to a width 499W of the image 499. For each slice 410-416 the controller 199 averages an intensity of the image pixels along the horizontal direction 495 (the terms horizontal and vertical being used or reference and ease of explanation only) to produce an intensity profile 480 as a function of the vertical position within the slice 410-416. The intensity profile 480 for, e.g., slice 410 is illustrated in FIG. 4B for a portion of the substrate stack, where each substrate edge 433 (corresponding to outer edge 233) is identified by a peak 489 (only some of which are labeled in FIG. 4B for clarity) over background levels 488. A thickness of each substrate S can be determined based on a width of a respective peak base where as can be seen in FIG. 4B the peak base of the peak corresponding to slot 13 in the substrate stack 270 has a width that is roughly twice the expected thickness of a substrate S (where the pixel size of the image can be converted to inches or millimeters by controller 199 in any suitable manner such as through image recognition of substrate cassette features having known sizes), which is indicative of two substrates S, one on top of the other, in the same slot (e.g., the "double" state illustrated in FIG. 5). As can also be seen in FIG. 4B, the peak 489 corresponding to slot 13 comprises a "double peak" that is also indicative of two substrates S, one on top of the other, in the same slot.

With the intensity profile 480 established and the peaks 489 determined, for each substrate slot, the controller 199 searches for/determines which peaks are vertically located closest to a predetermined baseline height for the respective substrate holding slot (a predetermined vertical position within the cassette at which a substrate is to be held, i.e., a slot height). Here the peaks are correlated with the substrate slot heights so as to determine if a substrate is held in the respective substrate holding slot. Where a peak is found and correlated to a substrate holding height, the positions along the peak in the intensity profile 480 form a raw edge profile of the substrate in the respective substrate holding slot. For example, the height of slot 18 is identified in FIG. 4b, where the peak 489A is substantially centered relative to the slot 18 height such that the controller 199 correlates peak 489A with slot 18 to indicate that a substrate is present in slot 18. The true edge profile 500T (FIG. 5) of any given substrates S is determined by the controller 199 by subtracting the vertical position of the calibrated base lines (at the horizontal position of the image slice) from the vertical position of the raw profile (for that given substrate S at the same horizontal position of the image slice) for each data point (of the raw profile) in the intensity profile 480. The thickness of the given substrate S is determined by the controller 199 to be the mean of the thickness measured from all data points on the respective raw profile.

Figure 6B:
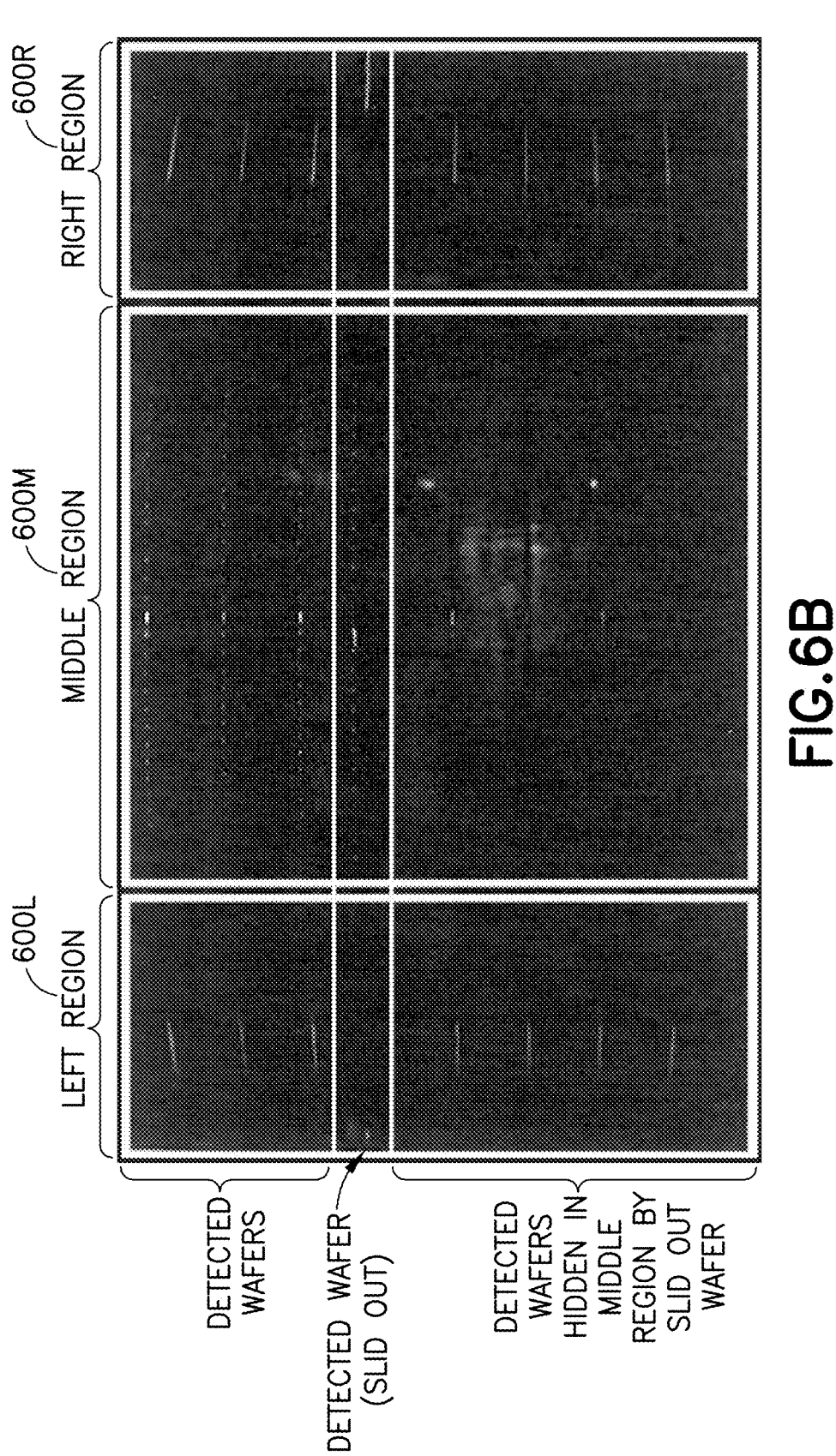
FIGS. 6B and 6C are exemplary images of substrates in a stack of substrates in accordance with aspects of the present disclosure.
Figure 6C:
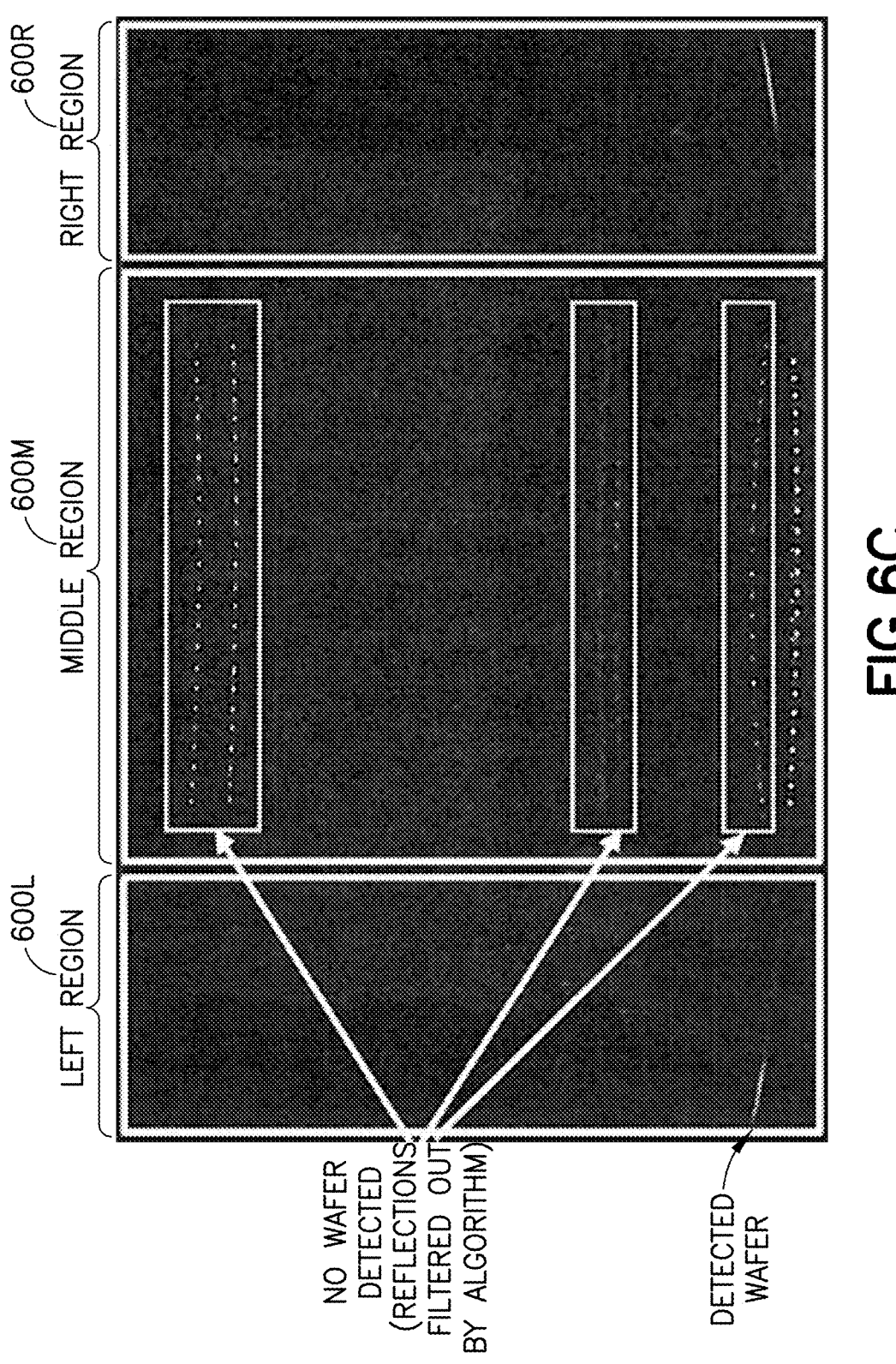
Figure 6D:
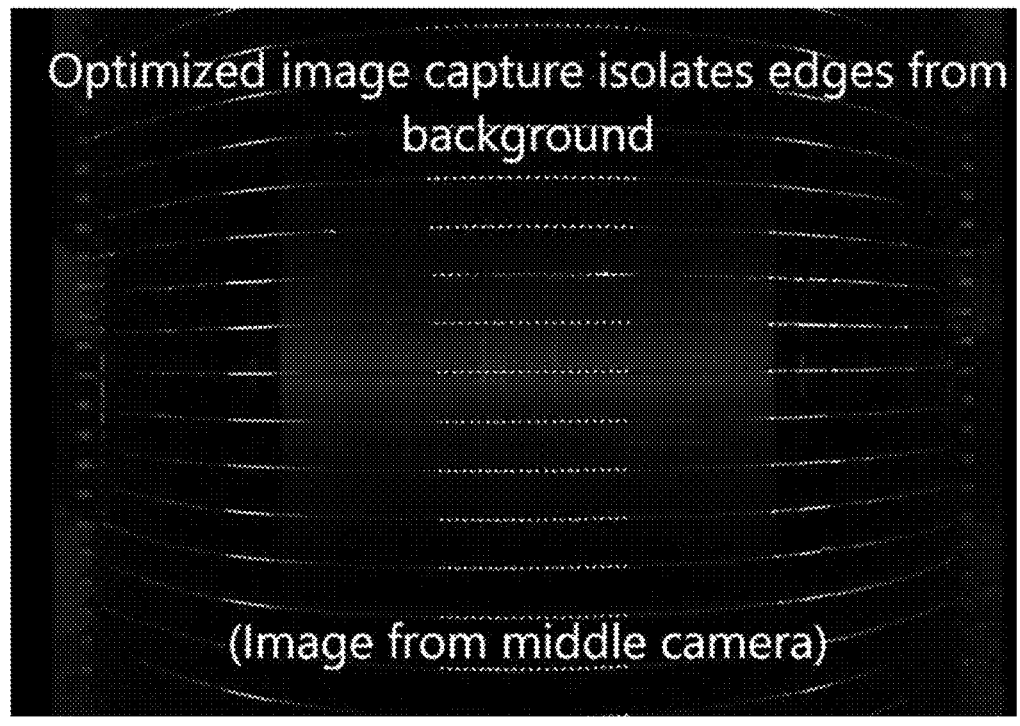
FIG. 6D is an example of image optimization showing an optimization of an image of a stack of substrates so as to isolate edges from a background of the image in accordance with aspects of the present disclosure.
Figure 6E:
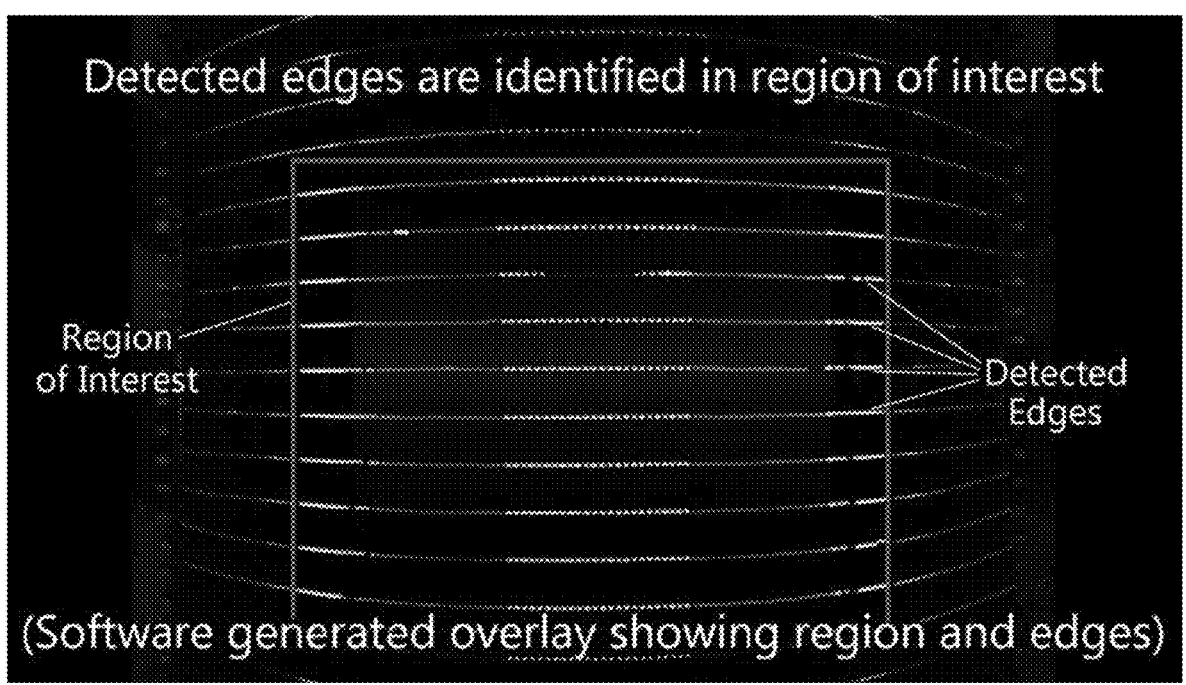
FIG. 6E is an example of the isolates edges of FIG. 6D in a region of interest in accordance with aspects of the present disclosure.

In one or more aspects, referring to FIGS. 6B, 6C, and 6D, the edge defining algorithm includes dividing (e.g., with controller 199) the raw images from the at least one camera 210 into a middle region 600M, a left region 600L, and a right region 600R. The left region 600L is illuminated substantially by illuminator 220V2, the right region 600R is illuminated substantially by illuminator 220V1, and the center region 600M is illuminated substantially by illuminator 220H; however, in other aspects the regions 600M, 600L, 600R may be illuminated in any suitable manner by any one or more of the illuminators described herein. Here, the above-noted states are determined (e.g., in a manner similar to that described above with respect to image intensity profiles) for each of the middle region 600M, the left region 600L, and the right region 600R. Substrates that are disposed below (or above depending on the camera and/or lighting angles) a substrate that is slid out of the substrate carrier 110 may be hidden from view by the slid out substrate and may not be detected in the middle region 600M but those hidden substrate are detectable in the left region 600L and the right region 600R (see FIG. 6B). As illustrated in FIG. 6B, the fourth substrate (or wafer) from the top of the image (identified as the "detected wafer (slid out)") has slid out of the substrate carrier 110 and is blocking light from shining on substrates below the slid out substrate in the middle region 600M; however the substrates below the slid out substrate are visible in the left region 600L and the right region 600R. Here a substrate for any given slot is detected (i.e., identified as present) when that substrate is detected in both of the left region 600L and the right region 600R for that given slot as illustrated in FIG. 6B. Reflections detected in the middle region 600M but in the left region 600L and right region 600R for any given slot are mapped as being absent (e.g., an empty slot) (see FIG. 6C). As can be seen in FIG. 6C, areas in the image corresponding to substrate holding slots in which a reflection in the middle region 600M exists but where there are no corresponding reflections in both the left region 600L and the right region 600R are mapped as being empty slots (i.e., substrate is absent).

Figure 6F:
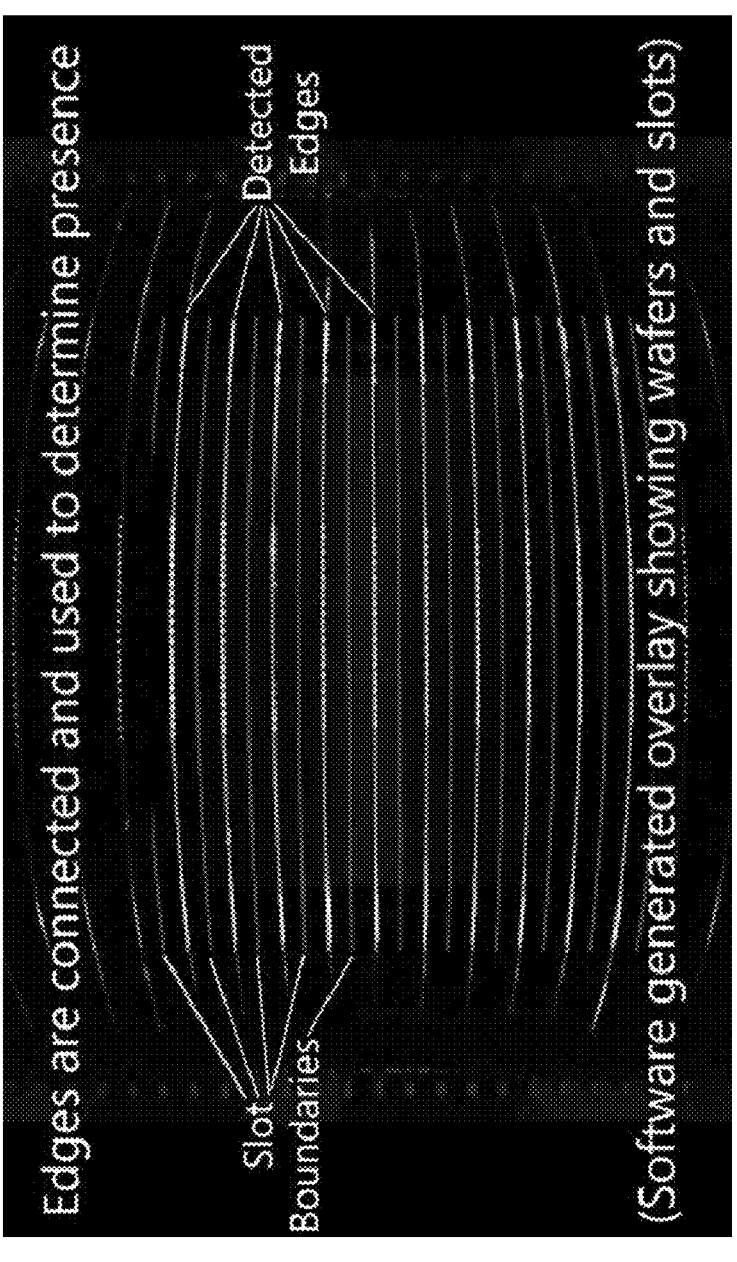
FIG. 6F is an example of image optimization where the isolates edges of FIG. 6D within a common substrate holding slot of a carrier being connected and present with boundaries of the respective substrate holding slots in accordance with aspects of the present disclosure.

FIG. 6D illustrates an image, captured by at least one camera 210 located in the middle center MC of the far plane 301 that has been optimized by the controller 199 (using any suitable image processing such as that described herein) that illustrates detected substrate edges in the middle region 600M, the left region 600L, and the right region 600M. The controller 199 is configured to detect (through any suitable image processing such as described herein) the edges of the substrates in any suitable region of interest (that is inclusive of each of the middle region 600M, the left region 600L, and the right region 600M) within the captured as illustrated in FIG. 6E. As can be seen in FIG. 6F, the controller 199 is configured to connected the detected edges (corresponding to the substrate holding slots of the substrate carrier 110 which have slot boundaries that are known to the controller) in each of the middle region 600M, the left region 600L, and the right region 600M to determine substrate presence.

One or more of the middle region 600M, the left region 600L, and the right region 600R in FIGS. 6B and 6C is/are employed for detecting substrate warp/bow as described herein.

At this point in the edge defining algorithm sufficient data is obtained to perform substrate mapping of the states of the substrates S in the substrate cassette 110 by employing the exemplary substrate mapping rules described above.

Figure 9A:
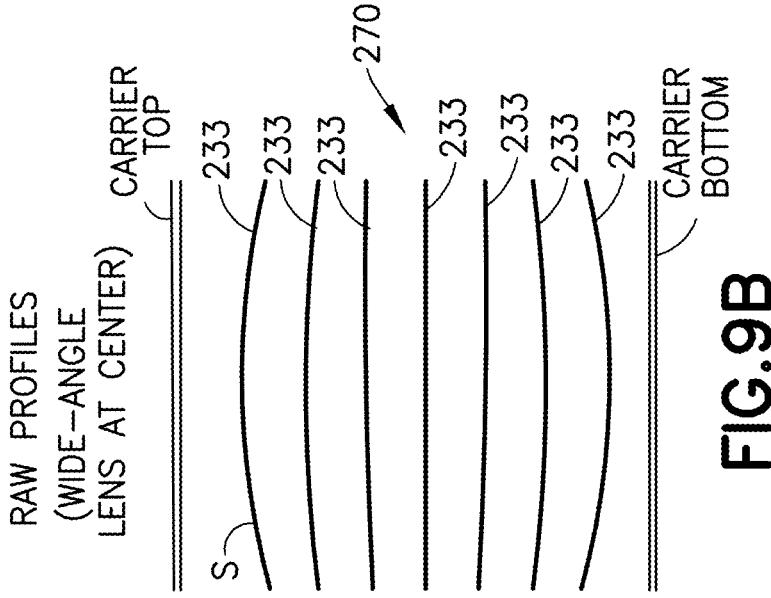
FIGS. 9A, 9B, 9C, and 9D are exemplary schematic illustrations of raw edge profiles and true profiles of substrates imaged from different angles in accordance with aspects of the present disclosure.
Figure 9B:
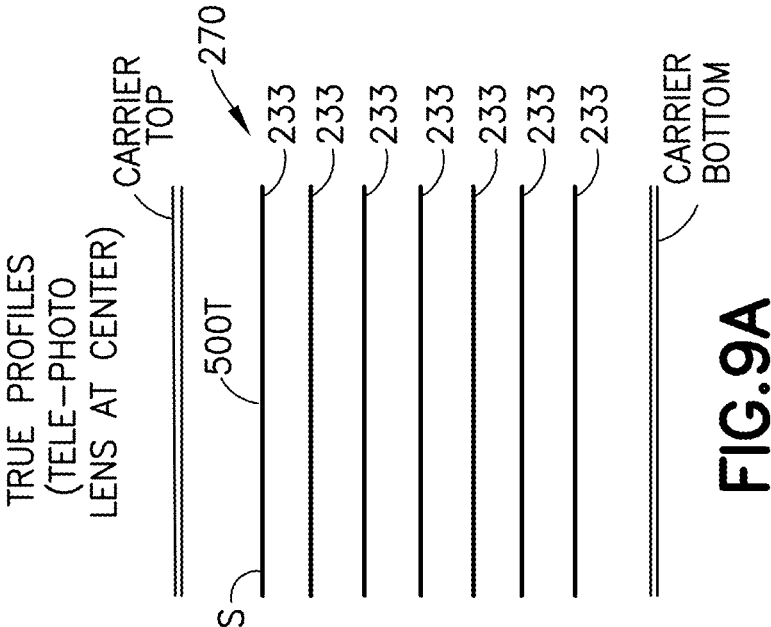
Figures 9C, 9D:
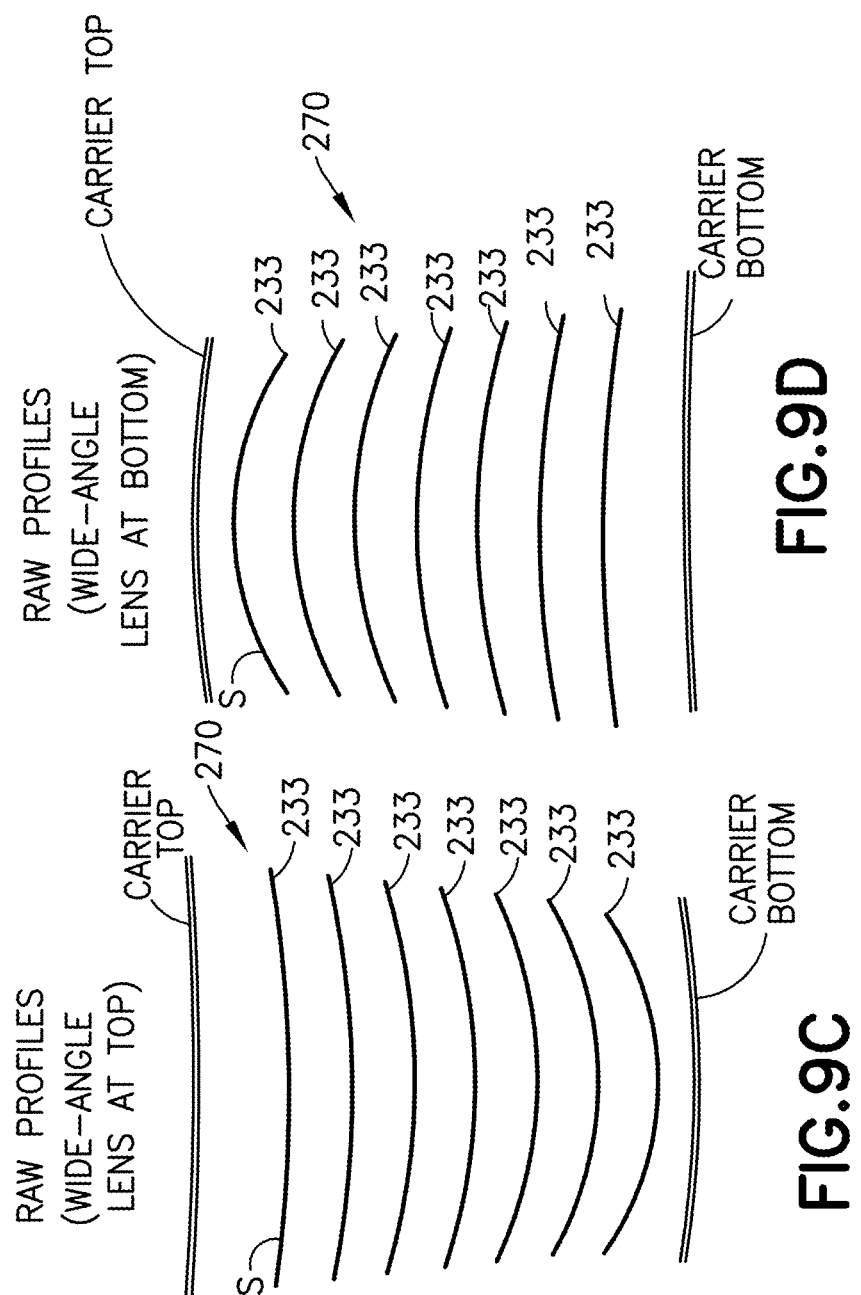

It is noted that for edge profiling of the substrates further data is desired (in addition to the data obtained for mapping) for determining bows/warps of the substrate that may hinder picking of the substrates. As noted above, the raw profiles of the substrates may depend on a position of the at least one camera 210 imaging the substrates. The controller 199 is configured to transform the raw profiles to camera independent corrected true profiles 500TC (see FIGS. 10-13) by applying the spatial correction to the raw profiles (see FIG. 5). Examples of raw (edge) profiles compared to a true (edge) profile are provided in FIGS. 9A-9C. FIG. 9A illustrates a true edge profile 500T of each substrate S in the substrate stack 270. The true edge profile 500T is substantially equivalent to a raw image of a camera 210 (equipped with a telephoto lens) positioned on the far plane 301 (FIGS. 3A and 3B) and located at the middle center location MC. For exemplary purposes only a telephoto lens is a lens having a focal length of about 100 mm or greater and employed with a full-frame camera (i.e., a camera with an image sensor format that is the same size as a 35 mm format film); however in other aspects the telephoto lens focal length may be more or less than about 100 mm. Here, the curved shape of the substrate edge is not apparent as the direction of the three-dimensional to two-dimensional projection is substantially parallel to the substrate planes. FIG. 9B illustrates the raw image of a camera 210 (equipped with a wide angle lens) positioned at the near plane 300 at the middle center location MC. For exemplary purposes only a wide angle lens is a lens having a focal length of about 28 mm or less and employed with a full-frame camera; however, in other aspects the wide angle lens focal length may be more or less than about 28 mm. FIG. 9C is an illustration of the raw image of a camera 210 (equipped with the wide angle lens) located at the lower center location LC on the near plane 300 with its field of view pointed upwards (at an angle) towards the substrates S in the substrate stack 270. FIG. 9D is an illustration of the raw image of a camera 210 (equipped with the wide angle lens) located at the upper center location LC on the near plane 300 with its field of view pointed downwards (at an angle) towards the substrates S in the substrate stack 270. Here, the wide angle lens raw views (from the near plane 300) illustrate the effects of three-dimensional objects projecting in to the two-dimensional image plane of the camera field of view. As is apparent from FIGS. 9B-9D, the substrates' shapes become visible as the three-dimensional to two-dimensional projection lines are no longer parallel due to, for example, the close proximity to the camera 210. The further away the substrates are from the camera location, the more apparent the three-dimensional shape of the substrate is. The perspective also changes as the substrates are positioned further from the camera (as illustrated in FIGS. 9B-9D), where the substrates at further distances appear to be smaller than substrates at closer distances relative to the camera 210. The substrates in the raw images of FIGS. 9B-9D may also be distorted (e.g., barrel distortion) from characteristics of the wide angle lens.

The distortions of the substrate edges illustrated above in FIGS. 9B-9D can be corrected by the controller 199 by applying the spatial calibration data 281 to the raw images. The controller 199 is configured to transform the raw profiles into corrected true profiles 500TC with an empirical method, where the corrected true profiles 500TC provide for substrate warp/bow determination and end effector adjustment for picking and placing the warped/bowed substrates S. The empirical method includes an initial spatial calibration and spatial correction at runtime when measuring substrate profiles.

The controller 199 is communicably coupled to the camera array 277 and is programmed with each respective camera calibration (also referred to herein as the spatial calibration data 281), that has a baseline image (see the baselines 510 illustrated in FIGS. 5 and 10, where each baseline 510 for the respective substrate carrier 110 slots collectively form the baseline image) for the respective camera 210A, 210B, 210C. Examples of baseline images are provided in FIGS. 15A, 15B, 15C, and 15D (noting these baseline images correspond to, for exemplary purposes only, the raw and true profiles of FIGS. 9A, 9B, 9C, and 9D). The baseline image for each respective camera 210A, 210B, 210C (FIGS. 15A-15D illustrate baseline images for four cameras, one located at the far plane 301 center middle CM, and three located at the near plane center middle CM, upper center US, and lower center LC) is different from the baseline image of each other respective camera 210A, 210B, 210C (as is apparent in FIGS. 15A-15D) and defines predetermined baseline characteristics for each of at least one substrate S in each of the at least one corresponding slot of the corresponding separate different part of the substrate carrier 110 (see regions RA, RB, RC in FIG. 2C and the region of interest in FIG. 6E) imaged by the respective camera 210A, 210B, 210C. As will be described herein, the controller 199 is configured to register (such as in any suitable memory) the spatial calibration data 281 of each respective camera 210A, 210B, 210C, wherein a calibration wafer 1500 that characterizes the baseline image of the respective camera 210A, 210B, 210C is disposed in each of the at least one corresponding slot of the corresponding separate different part and imaged with the respective camera 210A, 210B, 210C defining the baseline image of the respective camera 210A, 210B, 210C registered by the controller 199.

Referring also to FIGS. 10-13, the initial spatial calibration is obtained by capturing raw profiles of flat substrates (e.g., the calibration wafers 1500 which are known to be flat and not bowed/warped) whose true profiles 500T and locations within the substrate stack 270 are known. The raw baseline or calibration images are saved in the controller 199

(or a memory 199M accessible by the controller 199) as spatial calibration data 281 (see FIG. 2A) for each respective camera 210A, 210B, 210C. The edge profiles of the calibration wafers 1500 corresponding to each of the substrate holding slots forms the baseline image and a baseline 510 position for each substrate (i.e., expected position of a respective substrate in the substrate carrier obtained from the baseline image) illustrated in, for example, FIGS. 5 and 10-13. Generally, spatial calibration is performed following camera installation, and re-run if the camera position or angle changes after initial installation. In one or more aspects, the calibration wafers 1500 are integrally formed with or otherwise affixed to a calibration cassette (substantially similar to cassette 110 but with the calibration wafers fixed therein in predetermined locations). Here the calibration wafers 1500 may be partial wafers coupled to the carrier so as to form the front edges of the wafers that are scanned/detected in the calibration images in the manner described herein. Here the calibration cassette forms with the integral calibration wafers a calibration wafer rack that is seated on a load port as a unit. In other aspects, the calibration wafers 1500 may be integrally formed as a stack of wafers that are inserted into a cassette as rack unit, with the predetermined spacing and vertical alignment between the integrally formed calibration wafers in the integral wafer stack. Here the integrally formed wafer stack may be seated on and/or removed from the slots of a cassette 110 as a rack unit.

Figure 10:
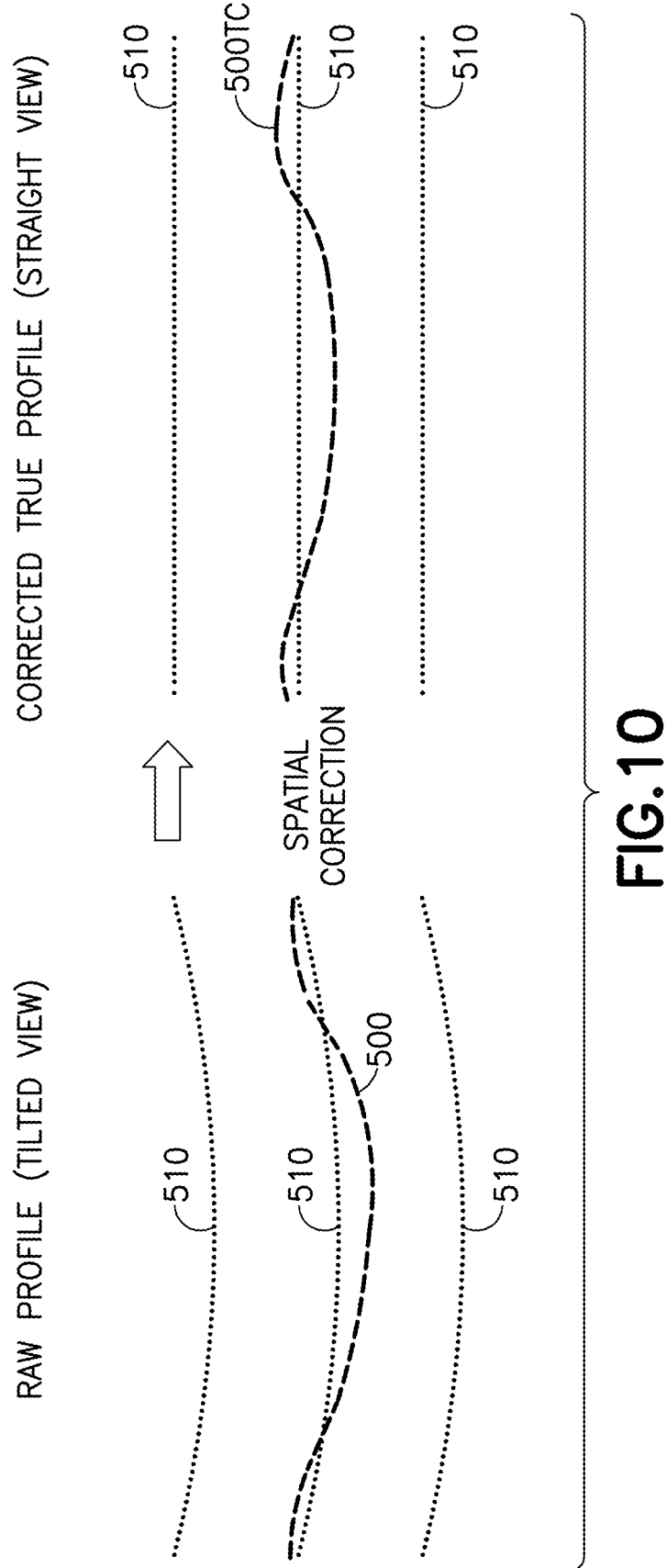
FIGS. 10, 11, 12, and 13 are exemplary illustrations of raw edge profiles and corrected true profiles in accordance with aspects of the present disclosure.

At runtime, where the substrate edge profiles are measured (such as for mapping and/or edge profiling), the controller 199 performs a spatial correction on the raw images/profiles where the spatial calibration data 281 is applied by the controller 199 to correct the raw profiles of the substrates and obtain the corrected true profiles 500TC by subtracting the raw profile of a substrate in a given slot from the baseline 510 for the given slot (e.g., where any deviations of the measured raw profile 500 from the baseline 510 represent a bow/warp of the substrate as represented in the corrected true profile 500TC (see the right-hand side of FIG. 10).

Figure 11:
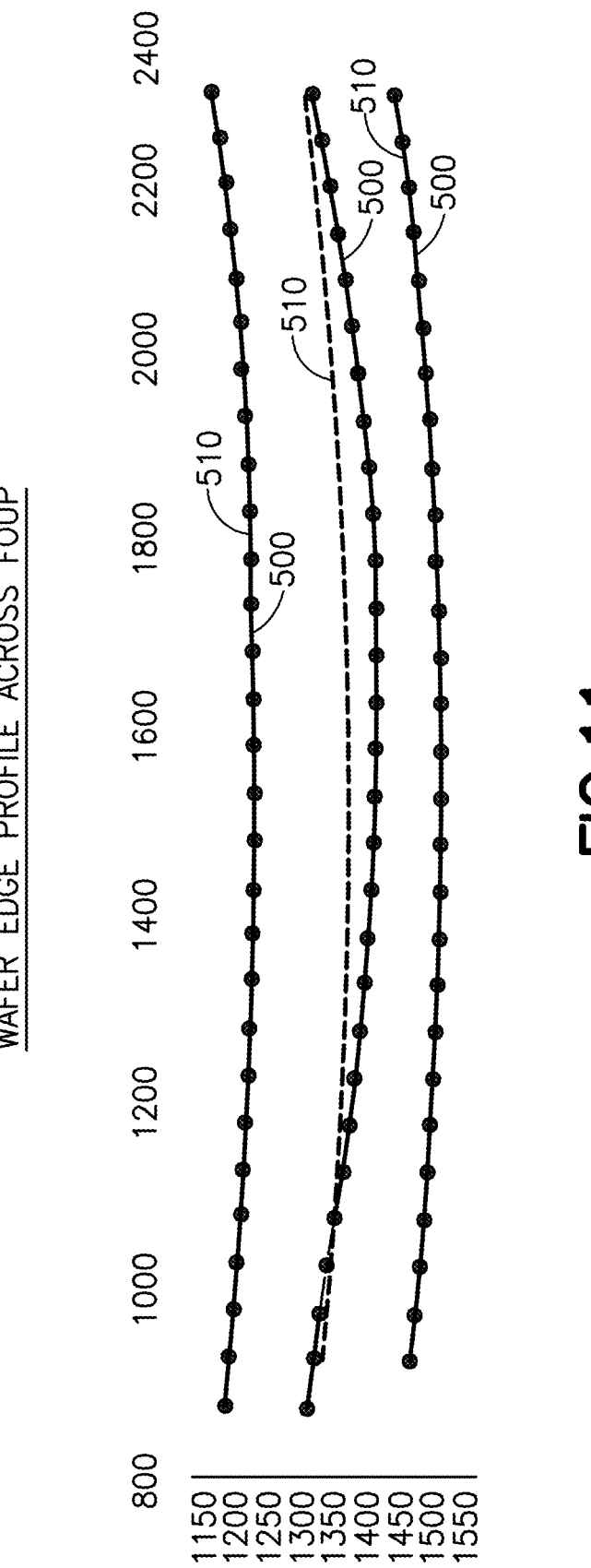
Figures 12, 13:
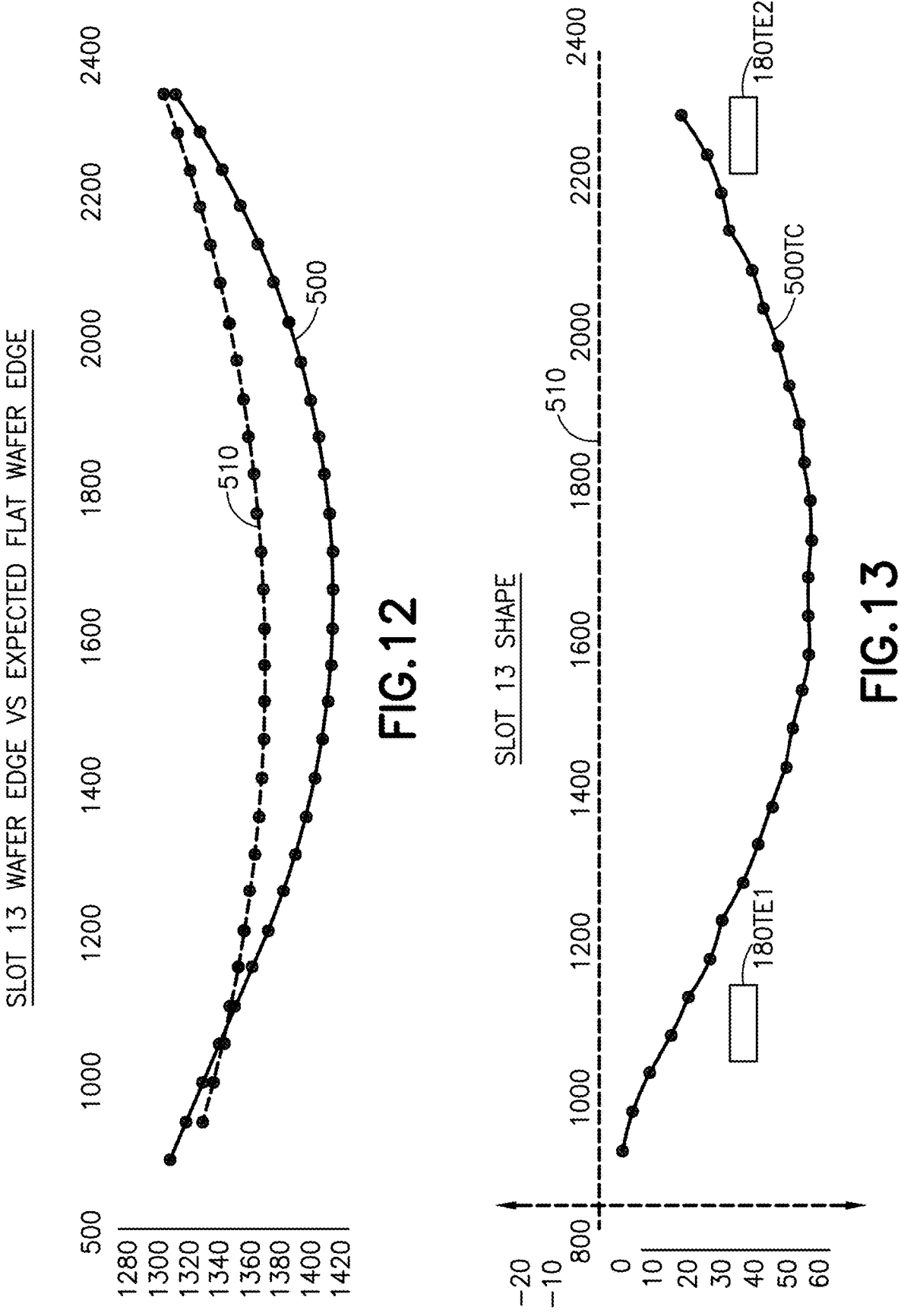

The spatial correction described herein provides for at least a transformation from a wide angle lens at close distance projection (e.g., at the near plane 300) to an equivalent of a telephoto lens at a long distance (e.g., at the far plane 301), correction of perspective effects corresponding to a camera's angle and distance from the substrates being imaged, correction of barrel distortion introduced by the wide angle lens, and correction of mechanical variation of position and direction in camera mounting. Experimental data obtained from employment of the spatial correction in edge profiling are illustrated in FIGS. 11-13 which illustrate the effectiveness of the spatial correction described herein. FIG. 11 illustrates raw profiles 500 of three substrates across the width of the substrate cassette 110. FIG. 12 illustrates the middle substrate (e.g., slot 13 substrate) of FIG. 11. FIG. 13 illustrates the corrected true profile 500TC of the slot 13 substrate, which exhibits a warp/bow. Further, it is noted that the spatial correction can be applied prior to or after the processing the image by slicing of the image into the vertical image slices 410-416.

As noted above, the substrate profiles are employed by the controller 199 when commanding the substrate transport 180 to pick substrates. Here the controller 199 may command the end effector 180E of the substrate transport to widen/increase the distance TD (see FIG. 1A) between the tines 180TE1, 180TE2 (See FIG. 1A), based on the corrected true profile 510TC of a substrate to accommodate any warp/bow in the substrate (e.g., such as in the slot 13 substrate of FIG.

13) by placing the tines 180TE1, 180TE2 in the exemplary locations illustrated in FIG. 13, such as where there is sufficient space to insert the tines below the substrate.

Figure 14:
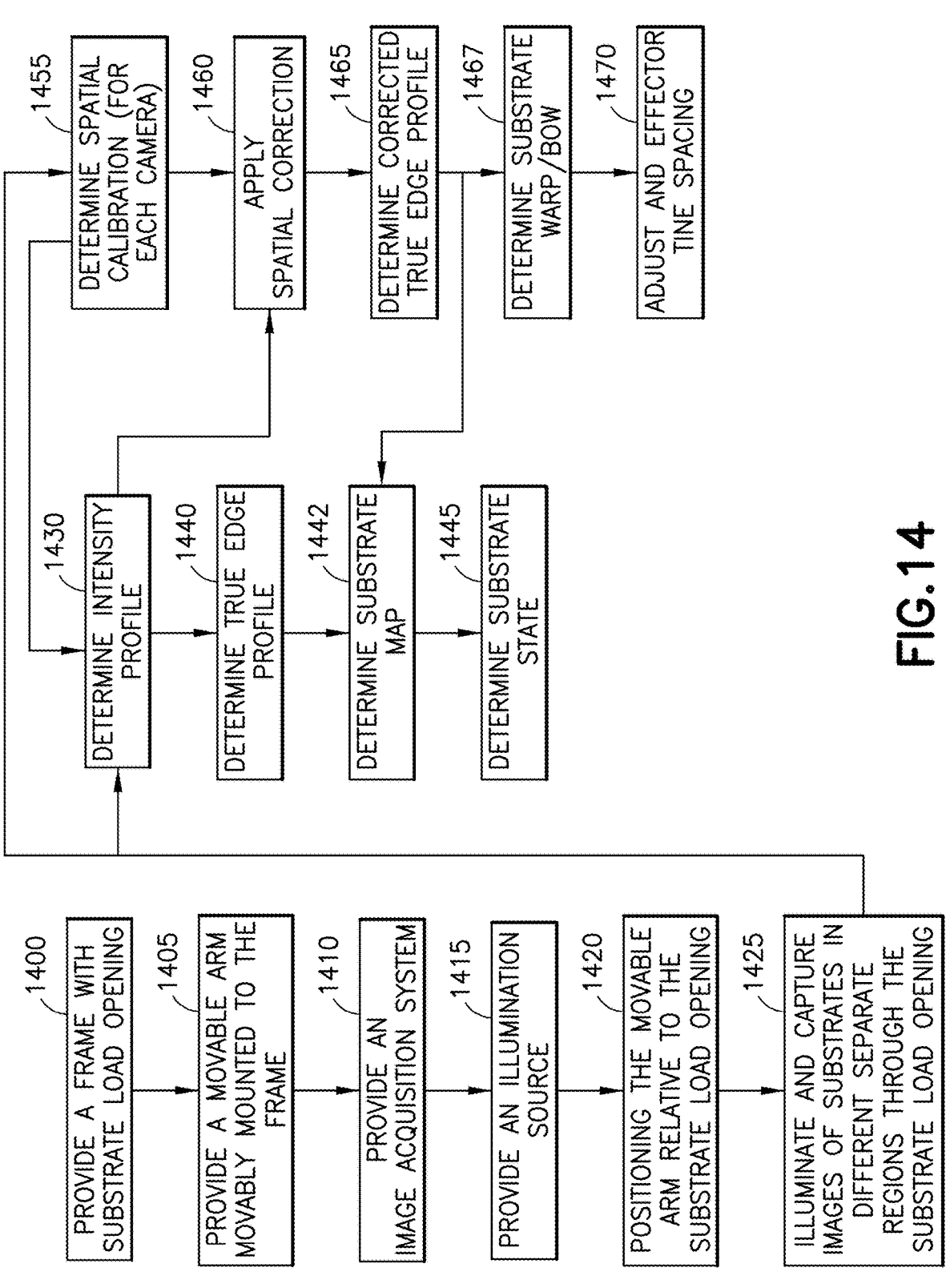
FIG. 14 is an exemplary flow diagram of a method in accordance with aspects of the present disclosure.

Referring to FIGS. 1A-1C, 2A-2C, 8A, 8B, and 14, an exemplary substrate mapping/edge profiling operation will be described. A frame 800 forming an opening 888 (e.g., a wafer load opening) that is in communication with a load port 120 is provided (FIG. 14, Block 1400). As described herein, the load port 120 is configured to hold a substrate carrier 110 where the substrate carrier 110 holds more than one substrates S vertically distributed within the substrate carrier 110 for loading through the opening 888 into the substrate processing apparatus 100, 150, 165. A transport arm 180TA (e.g., a movable arm) is provided and is mounted to the frame 800 (FIG. 14, Block 1405) so as to move relative to the opening 888. As described the transport arm 180TA includes an end effector 180E movably mounted to the transport arm 180TA for loading substrates from the substrate carrier 110 through the opening 888 to the substrate processing apparatus 100, 150, 165 (and vice versa).

The machine vision system 200 (e.g., image acquisition system) is provided (FIG. 14, Block 1410) and includes at least one camera 210. For exemplary purposes the method is described with respect camera array 277 but it should be understood that the method is equally applicable to images captured by a single camera. As described above, each respective camera 210A, 210B, 210C is positioned with a field of view FOVA, FOVB, FOVC disposed to view, through the opening 888 with the common support 244 positioned by the transport arm 180TA at a common position CP, a different separate part of the substrate carrier 110 with wafer slots for holding at least one of the more one substrates S, separate and different from parts of the substrate carrier 110 with different wafer slots for holding substrates S different than the at least one substrate S viewed by each other camera 210A, 210B, 210C with the common support 244 at the common position CP, and each substrate S held in the substrate carrier 110 is imaged by the camera array 277 with the common support 244 at the common position CP.

The at least one illuminator 220 is provided (FIG. 14, Block 1415) and is connected to the common support 244. As described above, the at least one illuminator is configured so as to illuminate, through the opening 888 with the common support 244 in the common position CP, an outer edge 233 of each substrate S in the substrate carrier 110, which edge delineates upper and lower edge boundaries 233U, 233L of the outer edge 233 of the substrate S. The at least one illuminator 220 is disposed with respect to each respective camera 210A, 210B, 210C, and the image of the corresponding separate different part (see, e.g., regions RA, RB, RC in FIG. 2C and the region of interest in FIG. 6E) by each respective camera 210A, 210B, 210C is disposed so that the outer edge 233 directs reflected edge illumination, from the at least one illuminator 220, at the respective camera 210A, 210B, 210C, and optically blanks, at the upper edge boundary 233U and the lower edge boundary 233L, background reflection light, in the image captured of the separate different part of the substrate carrier 110 by the respective camera 210A, 210B, 210C through the opening 888 with the common support 244 at the common position CP. As described herein, the outer edge 233 of the substrate S is defined with the upper and lower edge boundaries 233U, 233L in relief in image contrast, formed by and between the edge reflection and the optically blanked background, registered by each camera 210A, 210B, 210C so as to effect edge detection of each substrate S in the substrate carrier 110 with the common support 244 at the common position CP.

With the substrate carrier 110 seated on the load port 120, the controller 199 commands movement of the transfer arm 180TA so that the transfer arm 180TA is positioned relative to the opening 888 (FIG. 14, Block 1420) for imaging the substrates S within the carrier 110 through the opening 888. The substrates S are illuminated by the at least one illuminator 220 and images of the substrates S in the different separate regions (see, e.g., regions RA, RB, RC in FIG. 2C) are captured through the opening 888 by camera array 277 (FIG. 14, Block 1425). With the raw images of the substrates in each different separate region captured, the controller 199 is configured to perform one or more of determining a substrate map and determining substrate warp/bow. As described herein, mapping and determining warps/bows of substrates may be determined in any suitable order relative to one another such as where both are desired to be determined.

Figure 16A:
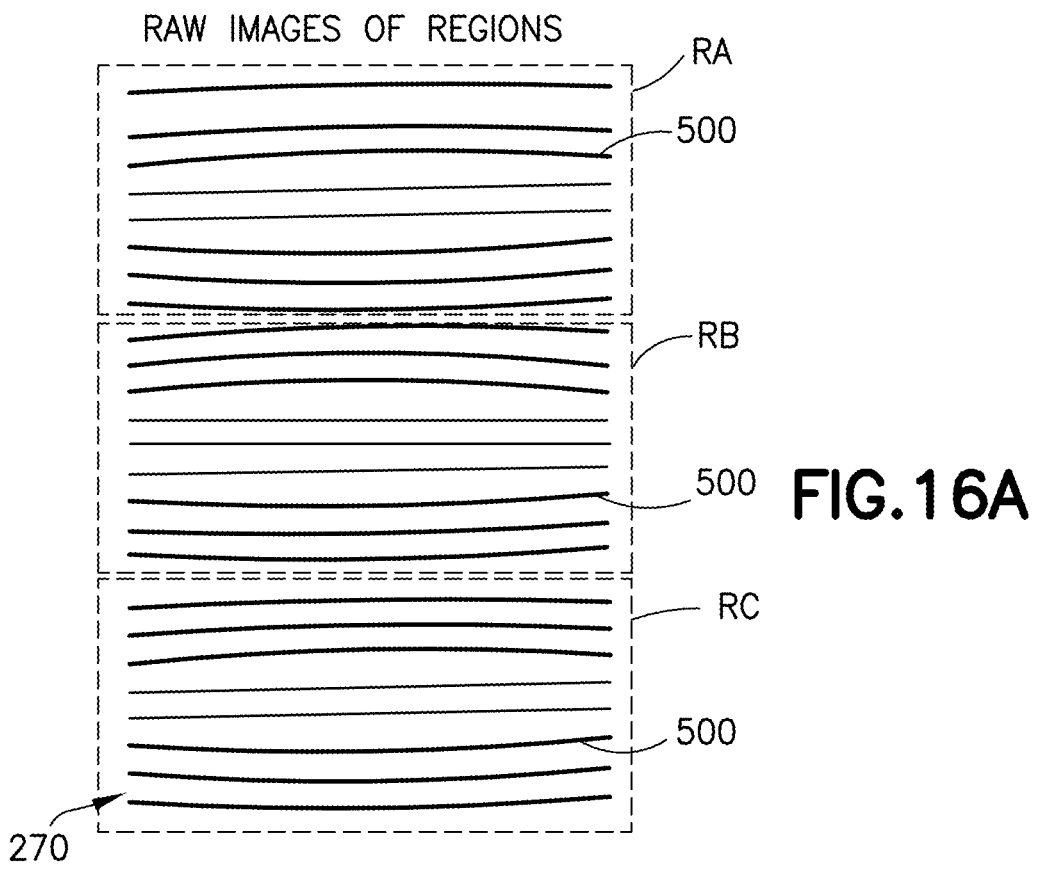
FIGS. 16A and 16B are schematic illustrations of raw and true profile images of substrates taken by multiple cameras each capturing an image of a respective different separate region of a substrate carrier in accordance with aspects of the present disclosure.
Figure 16B:
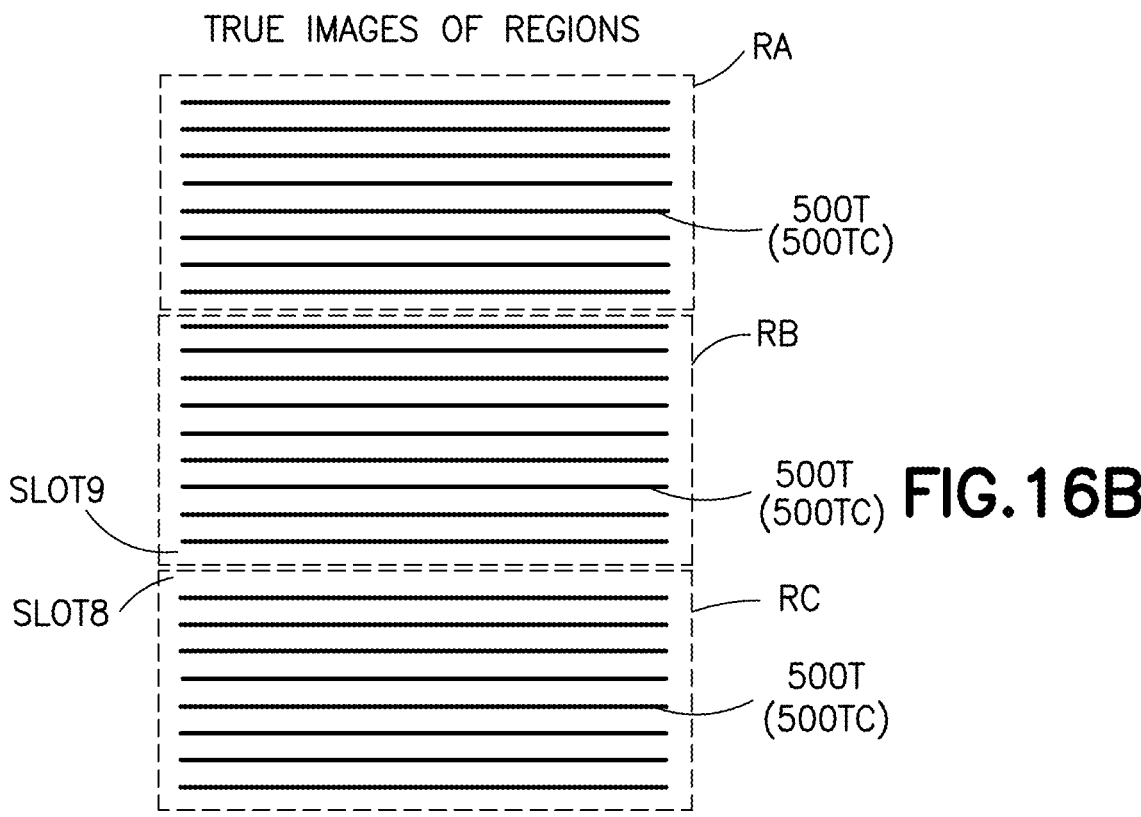

With respect to substrate mapping, the controller 199 determines the intensity profile 480 (see FIGS. 4A and 4B) in the manner described herein (FIG. 14, Block 1430) for each of the different separate regions (e.g., regions RA, RB, RC). From the intensity profile 480, the controller 199 determines the true edge profile 500T in the manner described herein (FIG. 14, Block 1440) and the so as to determine the substrate map 280 (FIG. 14, Block 1442) for each different separate region and the substrate carrier 110 as a whole. The substrate state (e.g., absent, present, double, cross, shift) is determined (FIG. 14, Block 1445) by the controller 199 from the substrate map 280 as described herein through employment of any suitable image processing algorithms for applying the substrate mapping rules to the true edge profiles 480. Referring briefly to FIG. 16B, the controller 199 is configured to compare adjacent substrate holding locations of adjacent different separate regions to determine, for example, cross-slotted substrates that span between the adjacent different separate regions. For example, as can be seen in FIG. 16B slots 8 and 9 of different separate regions RC and RB respectively are adjacent one another and in some aspects there may be a substrate that is cross-slotted between slots 8 and 9. The controller 199 is configured to employ the wafer mapping rules described herein in the slots that form the bounds between adjacent different separate regions (in this example referring to different separate regions RC and RB, the bounding slots are slots 8 and 9) when determining the substrate map 280 and the state of the substrates S in the substrate carrier 110 such as where multiple cameras 210A, 210B, 210C are employed for capturing images in different separate regions RA, RB, RC.

It is noted that capturing images in the different separate regions (e.g., multiple images from different cameras that cover a respective one of the different separate regions and are combined to form a substrate map) provides less distortion of the substrates S when the substrates S are imaged compared to imaging an entire substrate carrier 110 in a single image. For example, FIG. 16A illustrates raw profile images of substrates S captured from the cameras 210A, 210B, 210C for each respective different separate region RA, RB, RC and FIG. 16B illustrates true profile images of substrates S captured from the cameras 210A, 210B, 210C for each respective different separate region RA, RB, RC. When the distortion of the substrate profiles in each of the different separate regions RA, RB, RC are compared with the raw profiles of FIGS. 9B-9C it can be seen that there is less distortion of the substrates (i.e., between the raw profiles and the true profiles) when multiple cameras 210A, 210B, 210C are employed for imaging the respective different separate regions RA, RB, RC when compared to a single camera imaging all substrates S in the substrate carrier 110 at one time.

With respect to the determination of substrate warping/bowing, where spatial calibration data 281 does not exist for each camera 210A, 210B, 210C for the load port 120 on which the substrate cassette 110 is seated, the controller 199 obtains/determines the spatial calibration data 281 (FIG. 14, Block 1455) for each camera 210A, 210B, 210C in the manner described herein. The controller 199 determines the intensity profile 480 (see FIGS. 4A and 4B) of the substrates S held in the substrate carrier 210 (in each of the different separate regions) seated on the load port 210 in the manner described herein (FIG. 14, Block 1430). The spatial calibration data 281 is applied to the captured image (the imaged substrates thereof being identified through at least the intensity profile 480) (FIG. 14, Block 1460) so that the corrected true edge profile 500TC is determined for the imaged substrates S. For example, camera 210A corresponds with different separate region RA, camera 210B corresponds with different separate region RB, and camera 210C corresponds with different separate region RC. The spatial correction data 281 for camera 210A is applied to different separate region RA, the spatial correction data 281 for camera 210B is applied to different separate region RB, and the spatial correction data 281 for camera 210C is applied to different separate region RC. Any substrate warping/bowing of the substrates in the different separate regions RA, RB, RC is determined by the controller 199 in any suitable manner (such as with the image processing described herein) from the corrected true edge profiles 500TC of the substrates S (FIG. 14, Block 1467). The warping/bowing determination is employed by the controller 199 to adjust the distance TD (or spacing) (see FIG. 1A) between end effector tines 180ET1, 180ET2 for picking the warped/bowed substrates S (FIG. 14, Block 1470).

In accordance with one or more aspects of the present disclosure a semiconductor wafer mapping apparatus comprises: a frame forming a wafer load opening communicating with a load station for a substrate carrier disposed to hold more than one wafers vertically distributed in the substrate carrier for loading through the wafer load opening; a movable arm movably mounted to the frame so as to move relative to the wafer load opening and having at least one end effector movably mounted to the movable arm to load wafers from the substrate carrier through the wafer load opening; an image acquisition system including an array of cameras arranged on a common support and each camera is fixed with respect to the common support that is static with respect to each camera of the array of cameras, wherein each respective camera is positioned with a field of view disposed to view, through the wafer load opening with the common support positioned by the movable arm at a common position, a different separate part of the substrate carrier with wafer slots for holding at least one of the more than one wafers, separate and different from parts of the substrate carrier with different wafer slots for holding wafers different than the at least one wafer viewed by each other camera with the common support at the common position, and each wafer held in the substrate carrier is imaged by the array of cameras with the common support at the common position; and an illumination source connected to the common support configured so as to illuminate, through the wafer load opening with the common support in the common position, an outer edge of each wafer in the substrate carrier, which edge delineates upper and lower edge boundaries of the outer edge of the wafer, the illumination source being disposed with respect to each camera so that the outer edge directs reflected edge illumination, from the illumination source, at each camera, and optically blanks, at the upper and lower edge boundaries, background reflection light, viewed by each camera through the wafer load opening with the common support at the common position; wherein the outer edge of the wafer is defined with the upper and lower edge boundaries in relief in image contrast, formed by and between the edge reflection and the optically blanked background, registered by each camera so as to effect edge detection of each wafer in the substrate carrier with the common support at the common position.

In accordance with one or more aspects of the present disclosure each different separate part viewed by the respective camera of the array of cameras, has a different set of wafer slots, corresponding to the separate part and the respective camera, vertically distributed at predetermined reference heights viewed by the respective camera.

In accordance with one or more aspects of the present disclosure the semiconductor wafer mapping apparatus further comprises a controller communicably coupled to the movable arm to move the movable arm relative to the frame and position the common support at the common position.

In accordance with one or more aspects of the present disclosure the movable arm is an arm of a wafer transport robot having an end effector for loading and unloading wafers to and from the substrate carrier through the wafer load opening.

In accordance with one or more aspects of the present disclosure the illumination source is dispose relative to the respective camera so that reflected light from planar surfaces of the wafer and each other wafer slotted in the substrate carrier are optically blanked in each image by the respective camera of the different separate part of the substrate carrier.

In accordance with one or more aspects of the present disclosure a semiconductor wafer mapping apparatus comprises: a frame forming a wafer load opening communicating with a load station for a substrate carrier disposed to hold more than one wafers vertically distributed in the substrate carrier for loading through the wafer load opening; a movable arm movably mounted to the frame so as to move relative to the wafer load opening and having at least one end effector movably mounted to the movable arm to load wafers from the substrate carrier through the wafer load opening; an image acquisition system including an array of cameras arranged on a common support and each camera is fixed with respect to the common support that is static with respect to each camera of the array of cameras, wherein each respective camera is positioned with a field of view disposed to view, through the wafer load opening with the common support positioned by the movable arm at a common position, a corresponding different separate part of the substrate carrier each with at least one corresponding wafer slot different from at least one other wafer slot in each other corresponding different separate part of the substrate carrier, each of the corresponding different and separate parts being viewed, through the wafer load opening from the common position, by each respective camera, so that an image captured by each respective camera of the corresponding different separate part excludes each other different separate part viewed by each other respective camera, and each wafer in each slot in the substrate carrier is imaged by the array of cameras with the common support at the common position.

In accordance with one or more aspects of the present disclosure the semiconductor wafer mapping apparatus further comprises an illumination source connected to the common support configured so as to illuminate, through the wafer load opening with the common support in the common position, an outer edge of each wafer in the substrate carrier, which outer edge delineates upper and lower edge boundaries of the outer edge of the wafer, wherein the illumination source is disposed with respect to each respective camera, and the image of the corresponding separate different part by each respective camera is disposed so that the outer edge directs reflected edge illumination, from the illumination source, at respective camera, and optically blanks, at the upper and lower edge boundaries, background reflection light, in the image captured of the separate different part by the respective camera through the wafer load opening with the common support at the common position.

In accordance with one or more aspects of the present disclosure the outer edge of the wafer is defined with the upper and lower edge boundaries in relief in image contrast, formed by and between the edge reflection and the optically blanked background, registered by each respective camera so as to effect edge detection of each wafer in the substrate carrier with the common support at the common position.

In accordance with one or more aspects of the present disclosure each of the corresponding different separate part is imaged by but one respective camera of the array.

In accordance with one or more aspects of the present disclosure each of at least one wafer held in the corresponding wafer slot of the corresponding different separate part is imaged by but one of the respective camera of the array of cameras.

In accordance with one or more aspects of the present disclosure the semiconductor wafer mapping apparatus further comprises a controller communicably coupled to the array of cameras and programmed with each respective camera calibration, that has a baseline image for the respective camera, different from the baseline image of each other respective camera, the baseline image defining predetermined baseline characteristics for each of at least one wafer in each of the at least one corresponding slot of the corresponding separate different part imaged by the respective camera.

In accordance with one or more aspects of the present disclosure the controller is configured to register calibration of each respective camera, wherein a calibration wafer that characterizes the baseline image of the respective camera is disposed in each of the at least one corresponding slot of the corresponding separate different part and imaged with the respective camera defining the baseline image of the respective camera registered by the controller.

In accordance with one or more aspects of the present disclosure a method comprises: providing a frame forming a wafer load opening communicating with a load station for a substrate carrier disposed to hold more than one wafers vertically distributed in the substrate carrier for loading through the wafer load opening; providing a movable arm movably mounted to the frame so as to move relative to the wafer load opening and having at least one end effector movably mounted to the movable arm to load wafers from the substrate carrier through the wafer load opening; providing an image acquisition system including an array of cameras arranged on a common support and each camera is fixed with respect to the common support that is static with respect to each camera of the array of cameras; moving the movable arm so that each respective camera is positioned with a field of view disposed to view, through the wafer load opening with the common support positioned by the movable arm at a common position, a different separate part of the substrate carrier with wafer slots for holding at least one of the more than one wafers, separate and different from parts of the substrate carrier with different wafer slots for holding wafers different than the at least one wafer viewed by each other camera with the common support at the common position, and each wafer held in the substrate carrier is imaged by the array of cameras with the common support at the common position; and illuminating, with an illumination source connected to the common support, through the wafer load opening with the common support in the common position, an outer edge of each wafer in the substrate carrier, which edge delineates upper and lower edge boundaries of the outer edge of the wafer, the illumination source being disposed with respect to each camera so that the outer edge directs reflected edge illumination, from the illumination source, at each camera, and optically blanks, at the upper and lower edge boundaries, background reflection light, viewed by each camera through the wafer load opening with the common support at the common position; wherein the outer edge of the wafer is defined with the upper and lower edge boundaries in relief in image contrast, formed by and between the edge reflection and the optically blanked background, registered by each camera so as to effect edge detection of each wafer in the substrate carrier with the common support at the common position.

In accordance with one or more aspects of the present disclosure each different separate part viewed by the respective camera of the array of cameras, has a different set of wafer slots, corresponding to the separate part and the respective camera, vertically distributed at predetermined reference heights viewed by the respective camera.

In accordance with one or more aspects of the present disclosure the method further comprises commanding movement of the movable arm, with a controller communicably coupled to the movable arm, relative to the frame so as to position the common support at the common position.

In accordance with one or more aspects of the present disclosure the movable arm is an arm of a wafer transport robot having an end effector for loading and unloading wafers to and from the substrate carrier through the wafer load opening.

In accordance with one or more aspects of the present disclosure the illumination source is dispose relative to the respective camera so that reflected light from planar surfaces of the wafer and each other wafer slotted in the substrate carrier are optically blanked in each image by the respective camera of the different separate part of the substrate carrier.

It should be understood that the foregoing description is only illustrative of the aspects of the present disclosure. Various alternatives and modifications can be devised by those skilled in the art without departing from the aspects of the present disclosure. Accordingly, the aspects of the present disclosure are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A semiconductor substrate transport apparatus comprising:

a frame forming a substrate load opening communicating with a load station for a substrate carrier disposed to hold more than one substrates stacked in the substrate carrier for loading through the substrate load opening;

a movable door movably connected to the frame to open and close the substrate load opening;

a movable arm movably mounted to the frame so as to move relative to the substrate load opening and having at least one end effector movably mounted to the movable arm to load substrates from the substrate carrier through the substrate load opening;

an image acquisition system including at least one camera having a field of view disposed to view, through the substrate load opening with the at least one camera positioned by the movable door, substrate slots for holding at least one of the more one substrates in the substrate carrier, and each substrate held in the substrate carrier is imaged by the at least one camera positioned by the movable door; and an illumination source connected to and positioned by the movable door, in common with the at least one camera, so as to illuminate, through the substrate load opening, an outer edge of each substrate in the substrate carrier, which edge delineates upper and lower edge boundaries of the outer edge of the substrate, the illumination source being disposed with respect to the at least one camera so that the outer edge directs reflected edge illumination, from the illumination source, at the at least one camera, and optically obfuscates, at the upper and lower edge boundaries, background reflection light, viewed by the at least one camera through the substrate load opening;

wherein the outer edge of the substrate is defined in the image with the upper and lower edge boundaries in relief in image contrast, formed by and between the edge reflection and the optically obfuscated background, registered by the at least one camera so as to effect from the image of the outer edge determination of one or more of an amount of warp and an amount of bow for a selected respective one of the stacked substrates.

2. The semiconductor substrate transport apparatus of claim 1, wherein the end effector has movable tines that are adjusted to change a distance between the tines to pick up substrates that are one or more of warped and bowed.

3. The semiconductor substrate transport apparatus of claim 1, wherein the end effector has tines that are moved with respect to each other to pick up substrates based on the determination of the one or more of the amount of warp and the amount of bow for the selected respective one of the stacked substrates.

4. The semiconductor substrate transport apparatus of claim 1, wherein the illumination source is disposed relative to a respective camera so that reflected light from planar surfaces of the substrate and each other substrate slotted in the substrate carrier are optically obfuscated in each image by the respective camera.

5. The semiconductor substrate transport apparatus of claim 1, further comprising a controller communicably coupled to the movable door and at least one camera, the controller being configured to move the movable door to open and close the substrate load opening and to effect imaging the more than one substrates in the substrate carrier with one or more images as the movable door moves to open and close the substrate load opening.

6. The semiconductor substrate transport apparatus of claim 5, wherein the controller is configured to position the movable door at predetermined locations relative to the substrate carrier to effect imaging, with the at least one camera at each respective predetermined location, separate and different parts of the substrate carrier.

7. The semiconductor substrate transport apparatus of claim 6, wherein each separate and different part of the substrate carrier imaged by the at least one camera has a different set of substrate slots corresponding to the separate and different part of the substrate carrier.

8. The semiconductor substrate transport apparatus of claim 1, wherein the end effector is moved and adjusted, relative to the substrate load opening, based on determination of one or more of the amount of warp and the amount of bow for the selected respective one of the stacked substrates so as to effect picking of the selected respective one of the stacked substrates.

9. A semiconductor substrate transport apparatus comprising:

a frame forming a substrate load opening communicating with a load station for a substrate carrier disposed to hold more than one substrates stacked in the substrate carrier for loading through the substrate load opening;

a movable door movably connected to the frame to open and close the substrate load opening;

a movable arm movably mounted to the frame so as to move relative to the substrate load opening and having at least one end effector movably mounted to the movable arm to load substrates from the substrate carrier through the substrate load opening;

an image acquisition system including at least one camera having a field of view disposed to view, through the substrate load opening with the at least one camera positioned by the movable door, substrate slots for holding at least one of the more one substrates in the substrate carrier, and each substrate held in the substrate carrier is imaged by the at least one camera positioned by the movable door; and an illumination source connected to and positioned by the movable door, so as to illuminate, through the substrate load opening, an edge profile of each substrate in the substrate carrier, which edge profile delineates upper and lower edge boundaries of the edge profile of the substrate, the illumination source being disposed with respect to the at least one camera, positioned by the movable door, so that an outer edge of the substrate directs reflected edge illumination, from the illumination source, at the at least one camera, and optically obfuscates, at the upper and lower edge boundaries, background reflection light, viewed by the at least one camera through the substrate load opening;

wherein the edge profile of the substrate is defined in the image with the upper and lower edge boundaries in relief in image contrast, formed by and between the edge reflection and the optically obfuscated background, registered by the at least one camera so as to effect from the image of the edge profile determination of one or more of an amount of warp and an amount of bow for a selected respective one of the stacked substrates.

10. The semiconductor substrate transport apparatus of claim 9, wherein the end effector has movable tines that are adjusted to change a distance between the tines to pick up substrates that are one or more of warped and bowed.

11. The semiconductor substrate transport apparatus of claim 9, wherein the end effector has tines that are moved with respect to each other to pick up substrates based on the determination of the one or more of the amount of warp and the amount of bow for the selected respective one of the stacked substrates.

12. The semiconductor substrate transport apparatus of claim 9, wherein the illumination source is disposed relative to a respective camera so that reflected light from planar surfaces of the substrate and each other substrate slotted in the substrate carrier are optically obfuscated in each image by the respective camera.

13. The semiconductor substrate transport apparatus of claim 9, further comprising:

a controller communicably coupled to the movable door and at least one camera, the controller being configured to:

move the movable door to open and close the substrate load opening, and effect imaging the more than one substrates in the substrate carrier with one or more images as the movable door moves to open and close the substrate load opening; and wherein the controller is configured to position the movable door at predetermined locations relative to the substrate carrier to effect imaging, with the at least one camera at each respective predetermined location, separate and different parts of the substrate carrier.

14. The semiconductor substrate transport apparatus of claim 13, wherein each separate and different part of the substrate carrier imaged by the at least one camera has a different set of substrate slots corresponding to the separate and different part of the substrate carrier.

15. The semiconductor substrate transport apparatus of claim 9, wherein the end effector is moved and adjusted, relative to the substrate load opening, based on determination of one or more of the amount of warp and the amount of bow for the selected respective one of the stacked substrates so as to effect picking of the selected respective one of the stacked substrates.

16. A method comprising:

providing semiconductor substrate transport apparatus having:

a frame forming a substrate load opening communicating with a load station for a substrate carrier disposed to hold more than one substrates stacked in the substrate carrier for loading through the substrate load opening, a movable door movably connected to the frame to open and close the substrate load opening, a movable arm movably mounted to the frame so as to move relative to the substrate load opening and having at least one end effector movably mounted to the movable arm to load substrates from the substrate carrier through the substrate load opening, an image acquisition system including at least one camera, and an illumination source connected to the movable door;

positioning the at least one camera with the movable door so that a field of view of the at least one camera is disposed to view, through the substrate load opening, substrate slots for holding at least one of the more one substrates in the substrate carrier, and imaging each substrate held in the substrate carrier with the at least one camera positioned by the movable door;

illuminating through the substrate load opening, with the illumination source connected to and positioned by the movable door, in common with the at least one camera, an outer edge of each substrate in the substrate carrier, which edge delineates upper and lower edge boundaries of the outer edge of the substrate, the illumination source being disposed with respect to the at least one camera so that the outer edge directs reflected edge illumination, from the illumination source, at the at least one camera, and optically obfuscates, at the upper and lower edge boundaries, background reflection light, viewed by the at least one camera through the substrate load opening; and determining, from the image of the outer edge, one or more of an amount of warp and an amount of bow for a selected respective one of the stacked substrates, wherein the outer edge of the substrate is defined in the image with the upper and lower edge boundaries in relief in image contrast, formed by and between the edge reflection and the optically obfuscated background, registered by the at least one camera.

17. The method of claim 16, further comprising adjusting movable tines of the end effector to change a distance between the tines to pick up substrates that are one or more of warped and bowed.

18. The method of claim 16, further comprising moving tines of the end effector with respect to each other to pick up substrates based on the determination of the one or more of the amount of warp and the amount of bow for the selected respective one of the stacked substrates.

19. The method of claim 16, wherein the illumination source is disposed relative to a respective camera so that reflected light from planar surfaces of the substrate and each other substrate slotted in the substrate carrier are optically obfuscated in each image by the respective camera.

20. The method of claim 16, further comprising effecting, with a controller communicably coupled to the movable door and at least one camera, moving the movable door to open and close the substrate load opening and imaging with the at least one camera the more than one substrates in the substrate carrier with one or more images as the movable door moves to open and close the substrate load opening.

21. The method of claim 20, further comprising effecting, with the controller, positioning of the movable door at predetermined locations relative to the substrate carrier and imaging, with the at least one camera at each respective predetermined location, separate and different parts of the substrate carrier.

22. The method of claim 21, wherein each separate and different part of the substrate carrier imaged by the at least one camera has a different set of substrate slots corresponding to the separate and different part of the substrate carrier.

23. The method of claim 16, further comprising moving and adjusting the end effector, relative to the substrate load opening, based on determination of one or more of the amount of warp and the amount of bow for the selected respective one of the stacked substrates so as to effect picking of the selected respective one of the stacked substrates.

* * * * *